(12) United States Patent
Inukai

(10) Patent No.: US 6,989,805 B2
(45) Date of Patent: Jan. 24, 2006

(54) LIGHT EMITTING DEVICE

(75) Inventor: Kazutaka Inukai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 475 days.

(21) Appl. No.: 09/850,053

(22) Filed: May 8, 2001

(65) Prior Publication Data

US 2001/0038367 A1 Nov. 8, 2001

(30) Foreign Application Priority Data

May 8, 2000 (JP) ........................................ 2000-134810

(51) Int. Cl.
*G09G 3/30* (2006.01)

(52) U.S. Cl. ............................................ 345/76; 345/77
(58) Field of Classification Search .................... 345/66, 345/76, 77, 84, 87, 92, 94, 205, 100; 438/30, 438/45, 46, 166; 315/169.3
See application file for complete search history.

(56) References Cited

U.S. PATENT DOCUMENTS

| | | | | | |
|---|---|---|---|---|---|
| 5,652,600 | A | * | 7/1997 | Khormaei et al. | ............. 345/76 |
| 6,489,952 | B1 | * | 12/2002 | Tanaka et al. | ............... 345/205 |
| 6,587,086 | B1 | * | 7/2003 | Koyama | ..................... 345/77 |
| 6,617,644 | B1 | * | 9/2003 | Yamazaki et al. | .......... 257/347 |
| 6,635,505 | B2 | * | 10/2003 | Tanaka et al. | ................. 438/30 |
| 6,661,563 | B2 | * | 12/2003 | Hayashi et al. | ............. 359/296 |
| 6,753,654 | B2 | * | 6/2004 | Koyama | .................. 315/169.1 |
| 6,801,293 | B1 | * | 10/2004 | Nishiyama et al. | ......... 349/187 |

FOREIGN PATENT DOCUMENTS

JP 2000-242196 9/2000

OTHER PUBLICATIONS

U.S. Appl. No. 09/747,646, "Electronic Device" (pending application); specification, claims and drawings.
U.S. Appl. No. 09/724,387, "Electronic Device" (pending application); specification, claims and drawings.
U.S. Appl. No. 09/833,672, "Light Emitting Device" (pending application); specification, claims and drawings.

* cited by examiner

*Primary Examiner*—Vijay Shankar
*Assistant Examiner*—Prabodh M Dharia
(74) *Attorney, Agent, or Firm*—Fish & Richardson P.C.

(57) ABSTRACT

To provide an active matrix light emitting device that is capable of clear, multi-gray scale, color display. A pixel portion has a plurality of pixels each having an EL element, a switching TFT and an EL driver TFT. The EL element is composed of a pixel electrode, an opposing electrode, and an EL layer provided between the pixel electrode and the opposing electrode. The electric potential of the opposing electrode and the electric potential of the pixel electrode are controlled to obtain time division gray scale display.

50 Claims, 25 Drawing Sheets

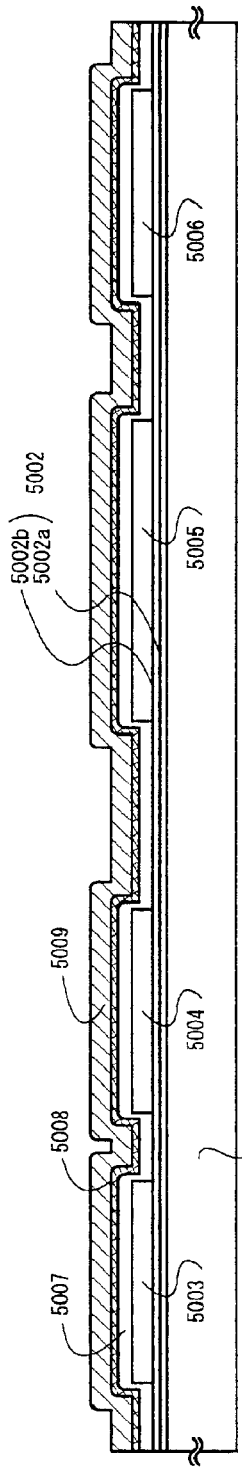
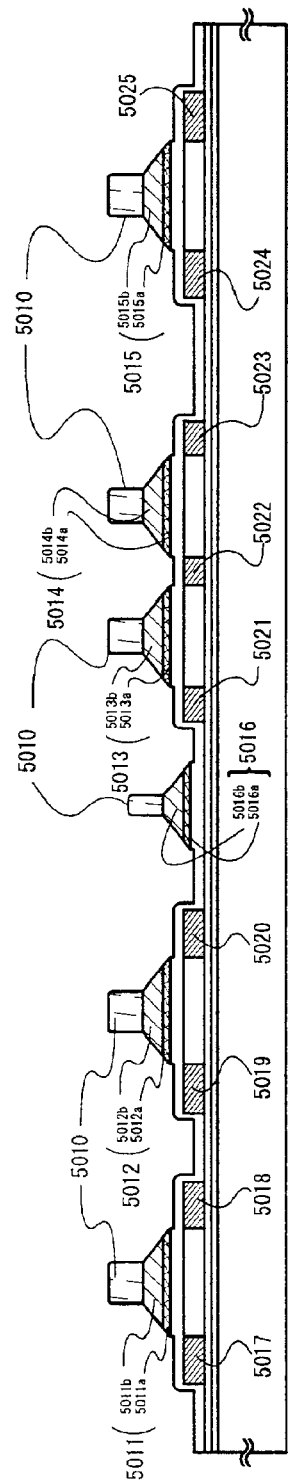
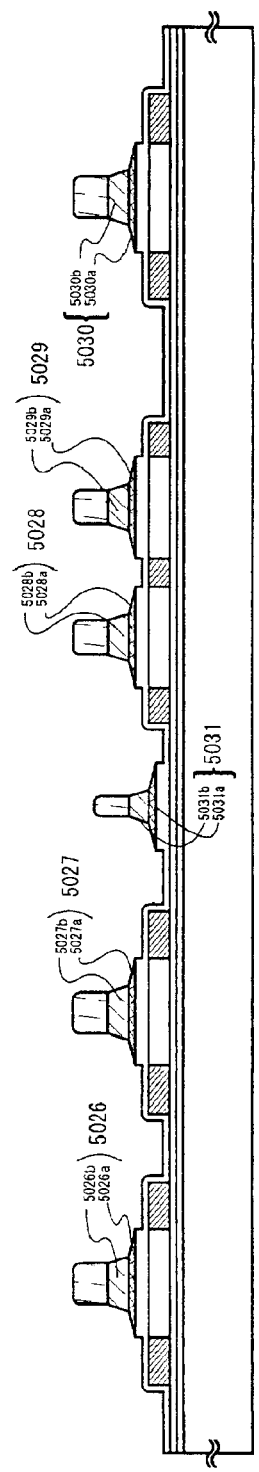
FIG. 10A
FIG. 10B
FIG. 10C

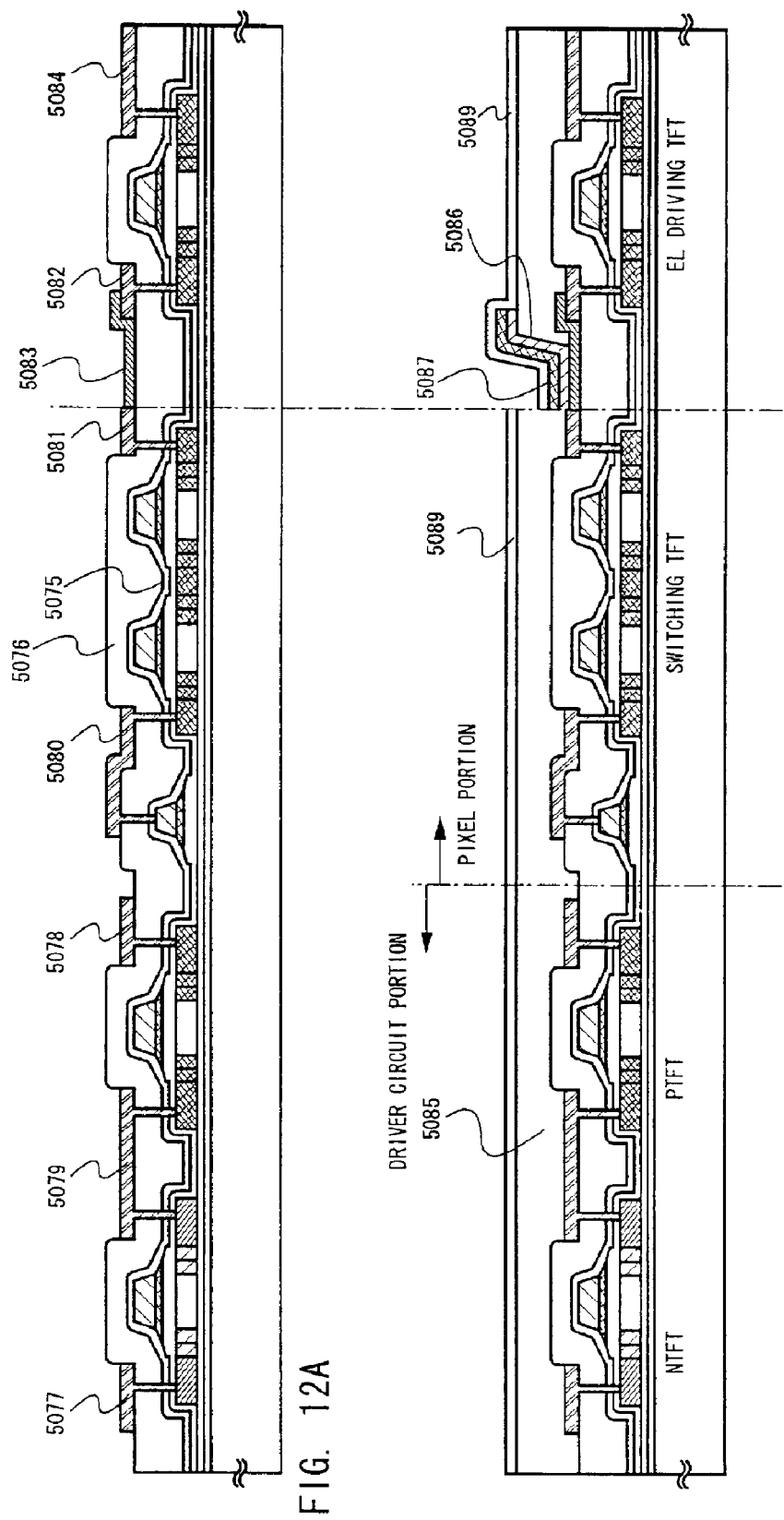

LIGHT EMITTING DEVICE

BACKGROUND OF THE INVENTION

1. Field of the Invention

The present invention relates to an electronic display formed by fabricating an EL (electro luminescence) on a substrate. In particular, the present invention relates to an EL display using a semiconductor element (an element which uses a semiconductor thin film). Further, the present invention relates to a light emitting device using an EL display in a display portion.

2. Description of the Related Art

Recently, a technique for forming TFTs on a substrate has been remarkably developed, and a development of its application to an active matrix electronic display has been continuously made. In particular, TFTs using a polysilicon film can operate at high speed, because such TFTs have a higher field effect mobility than TFTs using is a conventional amorphous silicon film. Therefore, the control of pixels, which has been conventionally conducted by a driver circuit provided outside a substrate, can be performed by a driver circuit provided on the same substrate on which the pixels are provided.

Such an active matrix electronic display includes various circuits and elements formed on the same substrate. With this structure, the active matrix electronic display provides various advantages such as reduced manufacturing cost, reduced size of an electronic display, an increased yield, and a reduced throughput.

Furthermore, an active matrix EL display including an EL element as a self-luminescent element has been actively studied. The EL display is also called an organic EL display (OELD) or organic light emitting diode (OLED).

In contrast with the liquid crystal display device, the EL display is self light emitting type. The EL element has such a structure that a layer containing an organic compound (hereinafter, referred to as an EL layer) is sandwiched between a pair of electrodes (anode and cathode). The EL layer generates luminescence by applying an electric field across the pair of electrodes. The organic compound layer has normally a lamination structure. As a typical example of the lamination structures, a lamination structure "hole transporting layer/light emitting layer/electron transporting layer" proposed by Tang et al. of Eastman Kodak Company is cited. This structure has an extremely high light emitting efficiency. For this advantage, most light emitting devices, which are currently under study and development, employ this structure.

Furthermore, the light emitting device may have such a lamination structure that a hole injecting layer, a hole transporting layer, a light emitting layer and an electron transporting layer are deposited on an anode or a hole injecting layer, a hole transporting layer, a light emitting layer, an electron transporting layer, and an electron injecting layer are deposited on an anode in this order. Moreover, the light emitting layer may be doped with a fluorescent pigment or the like.

Luminescence in the EL layer is divided into two types of light emission; one is light emission upon returning from singlet excitation to the base state (fluorescence) and the other is light emission upon returning from triplet excitation to the base state (phosphorescence). The light emitting device of the present invention may use one or both of the above two types of light emission.

All layers formed between a cathode and an anode are referred to generically as EL layers within this specification. The above stated hole injecting layer, hole transporting layer, light emitting layer, electron transporting layer, electron injecting layer, and the like are therefore all contained within the EL layer.

A predetermined voltage is then applied to the EL layer having the above structure by a pair of electrodes, recombination of a carrier thus occurs in the light emitting layer, and light is emitted. Note that the emission of light by the EL element is referred to as driving the EL element throughout this specification. Further, an EL element formed by an anode, an EL layer, and a cathode is referred to as an EL element throughout this specification.

As a method of driving an EL display, an analog driving method (analog drive) can be given. The analog drive of an EL display is described with reference to FIGS. 23 and 24.

FIG. 23 shows a structure of a pixel portion of an EL display that is driven in an analog manner. Gate signal lines (G1 through Gy) to which a gate signal from a gate signal line driver circuit is input are connected to a gate electrode of a switching TFT 1801 included in each pixel. One of a source region and a drain region of the switching TFT 1801 included in each pixel is connected to source signal lines (also referred to as data signal lines) S1 to Sx to which an analog video signal is input, whereas the other is connected to a gate electrode of an EL driver TFT 1804 included in each pixel and a capacitor 1808 included in each pixel.

A source region of the EL driver TFT 1804 included in each pixel is connected to power source supply lines V1 through Vx, whereas a drain region of the EL driver TFT 1804 is connected to an EL element 1806. An electric potential of the power source supply lines V1 through Vx is referred to as an power source electric potential. The power source supply lines V1 through Vx are connected to the capacitors 1808 included in the respective pixels.

The EL element 1806 includes an anode, a cathode and an EL layer sandwiched between the anode and the cathode. If the anode of the EL element 1806 is connected to the drain region of the EL driver TFT 1804, the anode and the cathode of the EL element 1806 become a pixel electrode and an opposing electrode, respectively. On the other hand, if the cathode of the EL element 1806 is connected to the drain region of the EL driver TFT 1804, the anode and the cathode of the EL element 1806 become an opposing electrode and a pixel electrode, respectively.

Note that the electric potential of the opposing electrode is referred to as an opposing electric potential in this specification. Note also that an power source for imparting the opposing electric potential to the opposing electrode is referred to as an opposing power source. The electric potential difference between the electric potential of the pixel electrode and the electric potential of the opposing electrode is an EL driver voltage, and the EL driver voltage is applied to the EL layer.

FIG. 24 shows a timing chart in the case where the EL display shown in FIG. 23 is driven in an analog manner. The period from the selection of one gate signal line until the selection of a next gate signal line is called one line period (L). The period from the display of one image to another image corresponds to one frame period (F) in analog driving. In the case of the EL display shown in FIG. 23, since there are y gate signal lines, y line periods (L1 to Ly) are provided within one frame period.

With the enhancement in resolution, the number of line periods within one frame period increases. As a result, the driver circuit must be driven at a high frequency.

A power source electric potential at the power source supply lines V1 through Vx is held constant, and an opposing electric potential at the opposing electrodes is also held constant. The opposing electric potential has a potential difference with the power source electric potential to such a degree that an EL element emits light.

The gate signal line G1 is selected in the first line period L1 by a gate signal input to the gate signal line G1 from the gate signal line driver circuit.

Note that, in this specification, the term gate signal line is selected refers to a state in which all of the thin film transistors having a gate electrode connected to the gate signal line are in an ON state.

An analog video signal is then input in order to the source signal lines S1 to Sx. All of the switching TFTs 1801 connected to the gate signal line G1 are in an ON state, and therefore the analog video signal input to the source signal lines S1 to Sx is input to gate electrodes of the EL driver TFTs 1804 through the switching TFTs 1801.

The amount of a current flowing through a channel formation region of the EL driver TFT 1804 is controlled by a level of an electric potential (voltage) of a signal input to the gate electrode of the EL driver TFT 1804. Accordingly, the electric potential applied to the pixel electrode of the EL element 1806 is determined by the level of the electric potential of the analog video signals input to the gate electrode of the EL driver TFT 1804. Then, the EL element 1806 is controlled by the electric potential of the analog video signals to emit light.

When the above-described operation is repeated to complete the input of analog video signals to the source signal lines (S1 through Sx), the first line period (L1) terminates. One line period may alternatively be constituted by the period until the completion of input of the analog video signals to the source signal lines (S1 through Sx) and a horizontal blanking period.

Then, a second line period (L2) starts where a gate signal line G2 is selected by a gate signal. And, as in the first line period (L1), analog video signals are sequentially input to the source signal lines (S1 through Sx) during the second line period.

When all gate signal lines (G1 through Gy) are selected in this manner, all lines periods (L1 through Ly) are completed. The completion of all the line periods (L1 through Ly) corresponds to the completion of one frame period. All pixels perform display during one frame period to form an image. One frame period may be alternatively constituted by all line periods (L1 through Ly) and a vertical blanking period.

The amount of light emitted by the EL element is thus controlled in accordance with the analog video signal, and gray scale display is performed by controlling the amount of light emitted. This method is namely a driving method referred to as an analog driving method, gray scale display is performed by changing the electric potential of the analog video signal input to the source signal lines.

The control of the amount of a current to be supplied to an EL element by a gate voltage of an EL driver TFT in an analog driving method as described above will be described in detail with reference to FIGS. 25A and 25B.

FIG. 25A is a graph showing a transistor characteristic of an EL driver TFT. In this graph, a line 2801 is referred to as an $I_{DS}-V_{GS}$ characteristic (or an $I_{DS}-V_{GS}$ curve). Here, $I_{DS}$ indicates a drain current, and $V_{GS}$ indicates a voltage (gate voltage) between a gate electrode and a source region. This graph allows to see the amount of current that flows at an arbitrary gate voltage.

When performing gray scale display in the analog driving method, the EL element is driven using a region shown by a dotted line 2802 of the above $I_{DS}-V_{GS}$ characteristic. An enlargement of the region surrounded by reference numeral 2802 is shown in FIG. 25B.

A region shown by slanted lines in FIG. 25B is referred to as a saturation region. Specifically, if the threshold voltage value is taken as $V_{TH}$, then this indicates a region in which the gate voltage satisfies $|V_{GS}-V_{TH}|<|V_{DS}|$, and the drain current changes exponentially with respect to changes in the gate voltage in this region. Electric current control is performed by the gate voltage using this region.

A gate voltage of an EL driver TFT is determined by an analog video signal which is input to a pixel by turning ON a switching TFT. At this time, based on the $I_{DS}-V_{GS}$ characteristic shown in FIG. 25A, a drain current with respect to a gate voltage is determined in a one-to-one correspondence. More specifically, a voltage of the analog video signal input to the gate electrode of the EL driver TFT determines an electric potential of the drain region. As a result, a predetermined amount of drain current flows into an EL element so that the EL element emits light in the amount corresponding to the amount of a current.

As described above, the amount of light emitted by the EL element is controlled by a video signal to perform gray-scale display.

However, the above analog driving has a disadvantage of being extremely affected by fluctuation in TFT characteristics. Even when the same gate voltage is applied to the EL driver TFTs of the respective pixels, the EL driver TFTs cannot output the same drain current if there exists a fluctuation in $I_{DS}-V_{GS}$ characteristics of the EL driver TFTs. Furthermore, as is apparent from FIG. 25A, since the region through which a drain current exponentially changes with respect to a change in gate voltage is used, the amount of a current to be output may greatly differ with a slight shift in $I_{DS}-V_{GS}$ characteristic even when the same gate voltage is applied to the TFTs for current control. Under such a condition, even when signals of the same voltage are input, the amounts of light emitted from the EL elements of adjacent pixels differ from each other due to a slight fluctuation in $I_{DS}-V_{GS}$ characteristic.

As described above, the analog driving is extremely sensitive to fluctuation in characteristic of EL driver TFTs, which is a problem in the gray-scale display of a conventional active matrix EL device.

SUMMARY OF THE INVENTION

The present invention has been made in view of the above problems, and has an object of providing an active matrix EL display allowing clear multi-gray scale color display. Moreover, the present invention has another object of providing light emitting devices (electronic appliances) with high performance, including such an active matrix EL display as a display.

The inventors of the present invention consider that the problems in analog driving result from conducting a gray-scale display using a saturated region that is susceptible to the effect of fluctuation in $I_{DS}-V_{GS}$ characteristic due to exponential change in a drain current with respect to a change in gate voltage.

More specifically, in the case where there is a variation in $I_{DS}-V_{GS}$ characteristic, a drain current exponentially varies with a change in gate voltage of a saturated region. Therefore, even if the same gate voltage is applied, different currents (drain currents) are output, resulting in inconvenience that a desired gray-scale cannot be obtained.

Thus, the present inventors considered controlling the amount of light emitted by an EL element, not through control of a current using a saturated region but mainly through control of a period during which the EL element emits light. In other words, the amount of light emitted by the EL element is controlled in terms of time to realize a gray-scale display in the present invention. A driving method for performing gray-scale display by controlling a light emitting period of an EL element is called a time-division driving method (hereinafter, referred to as digital driving). Gray-scale display realized by a time-division driving method is called time division gray-scale display.

In accordance with the above structure, even if there is some dispersion in the $I_{DS}$-$V_{GS}$ characteristic of the EL driver TFT, it becomes possible to avoid a situation in which the amount of light emitted by the EL elements differs greatly for adjacent pixels when signals having the same voltage are input with the present invention.

BRIEF DESCRIPTION OF THE DRAWINGS

In the accompanying drawings:

FIGS. 10A to 10C show a manufacturing process of the EL display according to the present invention;

FIGS. 12A to 12B show a manufacturing process of the EL display according to the present invention;

DETAILED DESCRIPTION OF THE PREFERRED EMBODIMENTS

[Embodiment Mode]

Hereinafter, a structure of an EL display according to the present invention and a driving method thereof will be described. The case where $2^n$ gray-scale display is performed by an n-bit digital video signal is herein described.

Figure 1:
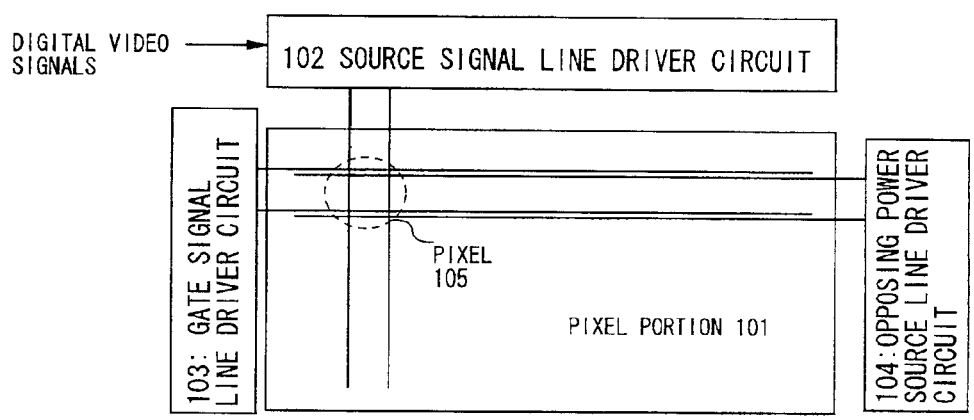
FIG. 1 is a block diagram showing a circuit structure of an El display according to the present invention.

FIG. 1 is an example of the block diagram showing an EL display of the present invention. The EL display in FIG. 1 has a pixel portion 101, and has a source signal line driver circuit 102, a gate signal line driver circuit 103 and an opposing power source line driver circuit 104 which are arranged in the periphery of the pixel portion 101. The pixel portion and the driver circuits are TFTs formed on a substrate. The EL display according to this embodiment mode has one source signal line driver circuit, one gate signal line driver circuit and one opposing power source line driver circuit. However, the present invention is not limited thereto. The number of the source signal line driver circuit, the gate signal line driver circuit and the opposing power source line driver circuit can be set discretionally.

Further, in the present invention the source signal line driver circuit 102, the gate signal line driver circuit 103, and the opposing power source line driver circuit 104 may also be implemented in the substrate on which the pixel portion 101 is formed in the present invention, and may also be connected to the pixel portion 101 through an FPC or a TAB formed on an IC chip.

Figure 2:
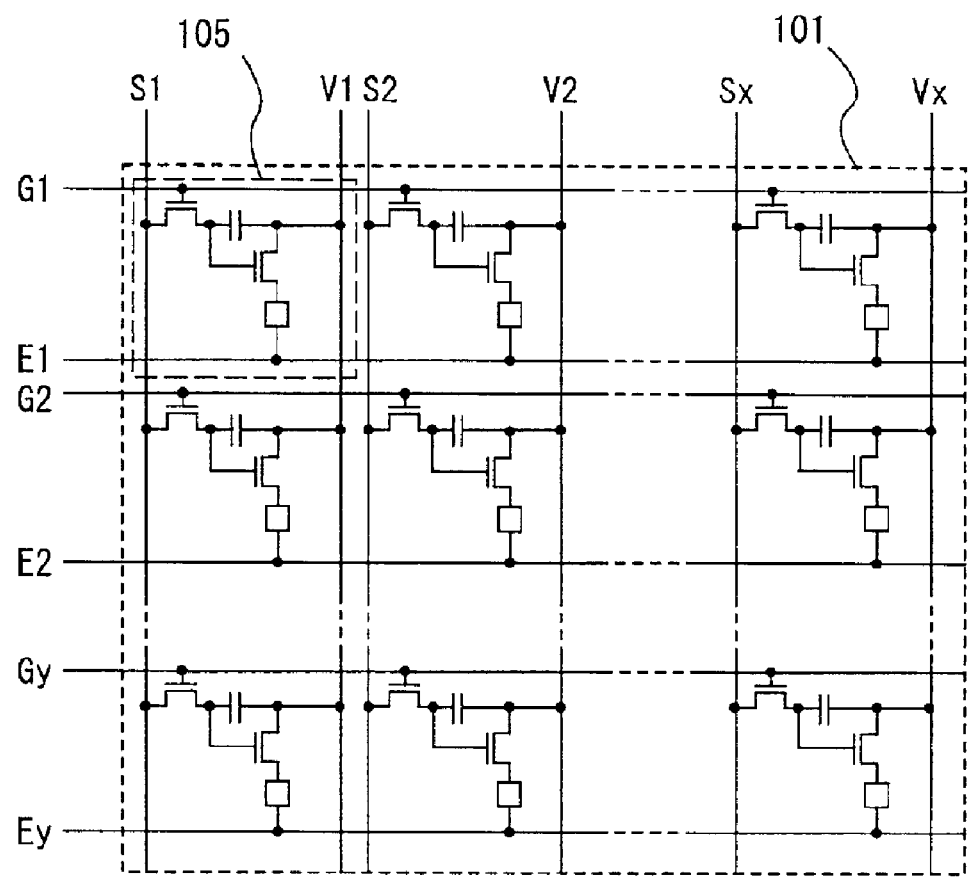
FIG. 2 is a circuit diagram of a pixel portion of the EL display according to the present invention.

FIG. 2 shows a blow up of the pixel portion 101. Source signal lines S1 to Sx, power source supply lines V1 to Vx, gate signal lines (first gate signal lines) G1 to Gy and the opposing power source lines E1 to Ey are formed in the pixel portion 101.

A region having one each of: the source signal lines S1 to Sx; the opposing power source lines V1 to Vx; the gate signal lines G1 to Gy; and the opposing power source lines E1 to Ey is a pixel 105. A plurality of the pixels 105 are arranged in a matrix shape in the pixel portion 101.

Figure 3:
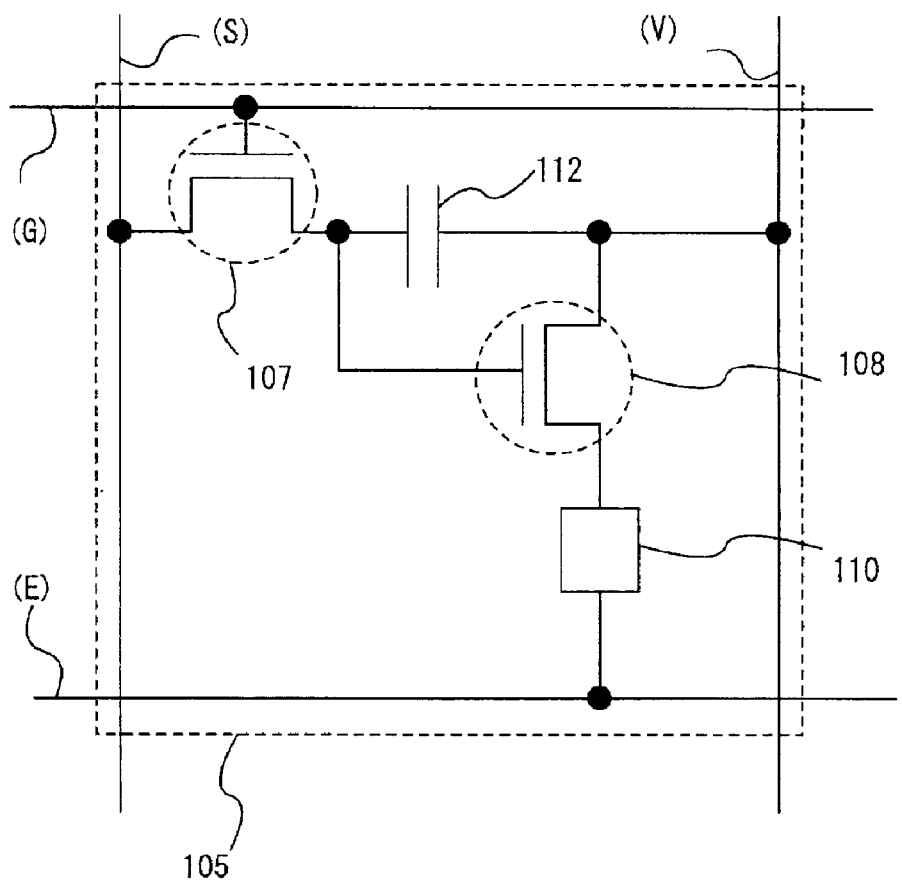
FIG. 3 is a circuit diagram of the pixel of the EL display according to the present invention.

An enlargement diagram of the pixel 105 is shown in FIG. 3. Reference numeral 107 denotes a switching TFT, reference numeral 108 denotes an EL driver TFT, reference numeral 110 is an EL element, and reference numeral 112 is a capacitor.

A gate electrode of the switching TFT 107 is connected to a gate signal line G (one of the gate signal lines G1 to Gy). One of a source region and a drain region of the switching TFT 107 is connected to a source signal line S (one of the source signal lines S1 to Sx), and the other is connected to a gate electrode of the EL driver TFT 108, to the storage capacitor 112 of each pixel.

The capacitor 112 is provided so as to retain a gate voltage of the EL driver TFT 108 when the switching TFT 107 is in a non-selected state (OFF state). Although the structure in which the capacitor 112 is provided is shown in this embodiment mode, the present invention is not limited thereto; the structure in which the capacitor 112 is not provided may also be employed.

A source region of the EL driver TFT 108 is connected to one of the power source supply lines V (V1 to Vx), and a drain region thereof is connected to the EL element 110. The power source supply lines V are connected to a power supply (not shown) provided outside the substrate on which the pixel portion 101 is formed, and are given a constant power supply electric potential.

For a recent typical EL display, in the case where the amount of light per light emitting region of a pixel portion is 200 cd/m$^2$, about several mA/cm$^2$ of a current per area of a pixel portion is needed. Therefore, when the size of the pixel portion is increased, it becomes difficult to control the electric potential applied from the power source provided in such as an IC to a power source supply line by a switch. In the present invention, however, the power source electric potential is always held constant. Therefore, since it is not necessary to control the electric potential level applied from the power source in the IC by a switch, the present invention is effective to realize a panel having a larger screen size.

The power source supply line V is connected to the capacitor 112.

The EL element 110 includes an anode, a cathode and an EL layer provided between the anode and the cathode. In the case where the anode is connected to the drain region of the EL driver TFT 108, the anode serves as a pixel electrode while the cathode serves as an opposing electrode. On the contrary, in the case where the cathode is connected to the drain region of the EL driver TFT 108, the cathode serves as a pixel electrode while the anode serves as an opposing electrode.

The opposing electrode of the EL element 110 is connected to one of the opposing power source lines E (E1 to Ey). The electric potential of the opposing power source lines E herein is called opposing electric potential.

The switching TFT 107 may be an n-channel TFT or a p-channel TFT, and the same applies to the EL driver TFT 108. However, it is preferable to use a p-channel TFT for the EL driver TFT 108 when the anode of the EL element 110 serves as the pixel electrode and the cathode of the EL element 110 serves as the opposing electrode. On the other hand, if the anode of the EL element 110 serves as the opposing electrode and the cathode of the EL element 110 serves as the pixel electrode, an n-channel TFT is preferably used for the EL driver TFT 108.

Further, the switching TFT 107 and the EL driver T0FT 108 may have, in addition to a single gate structure, a multi-gate structure such as a double gate structure or a triple gate structure.

A method of driving the EL display of the present invention shown by FIGS. 1 to 3 is explained next using FIG. 4.

First, the opposing electric potential given to the opposing power source line E1 is kept at an ON opposing electric potential by the opposing electrode power source line driver circuit 104. The ON opposing electric potential refers to an electric potential different from the power supply electric potential to a degree that causes the EL element to emit light when the power supply electric potential is given to the pixel electrode.

Then the gate signal line G1 is selected upon input of a gate signal inputted to the gate signal line G1 from the gate signal line driver circuit 103. As a result, the switching TFT 107 is turned ON in every pixel that is connected to the gate signal line G1 (pixels on the first line).

Then, the first bit of a digital video signal input to the source signal lines S1 to Sx from the source signal line driver circuit 102 is input to the gate electrodes of the EL driver TFTs 108 through the switching TFTs 107. Note that the input of the digital video signal to the gate electrodes of the EL driver TFTs 108 through the switching TFTs 107 indicates that the digital video signal is inputted to the pixels in this specification.

The digital video signal has information of "0" or "1". The digital video signal of "0" and "1" are signals where one has a Hi level voltage, while the other has a Lo level voltage.

In this embodiment mode, in the case where the digital video signal has information of "0", the EL driver TFT 108 is turned OFF. Accordingly, the power source electric potential is not applied to the pixel electrode of the EL element 110. As a result, the EL element 110 included in the pixel, to which the digital video signal having information of "0" is input, does not emit light.

On the contrary, in the case where the digital video signal has information of "1", the EL driver TFT 108 is turned ON. Accordingly, the power source electric potential is applied to the pixel electrode of the EL element 110. As a result, the EL element 110 included in the pixel, to which the digital video signal having information of "1" is input, emits light.

In this embodiment mode, in the case where the digital video signal has information of "0", the EL driver TFT 108 is turned OFF, and in the case where the digital video signal has information of "1", the EL driver TFT 108 is turned ON. However, the present invention is not limited to such a structure. Alternatively, the EL driver TFT 108 may be turned ON with the digital video signal having information of "0", and the EL driver TFT 108 may be turned OFF with the digital video signal having information of "1".

In this way, simultaneously with the input of the digital video signal of the first bit of pixels, the EL elements 110 are brought into a light emitting state or a non-light emitting state so that the pixels on the first line perform display. A period during which pixels perform display is referred to as a display period Tr. In particular, a display period that starts with the input of the digital video signal of the first bit to a pixel is designated as Tr1. The timing at which the display period of each line starts has a time difference, respectively.

When the gate signal line G1 is selected no longer, the opposing power source line E2 is given and kept at the ON opposing electric potential by the opposing power source line driver circuit 104 while the opposing power source line E1 is kept at the ON opposing electric potential. The gate signal line G2 is selected upon input of the gate signal, so that the switching TFT 107 is turned ON in every pixel that is connected to the gate signal line G2 and the 1 bit digital video signal is inputted from the source signal lines S1 to Sx into the pixels on the second line.

The opposing power source lines are given the opposing electric potential sequentially as above until all of the opposing power source lines E1 to Ex are kept at the opposing electric potential. Thus the gate signal lines G1 to Gy are all sequentially selected, so that the 1 bit digital video signal is inputted to all of the pixels. The period required to input the 1 bit digital video signal into the entire pixels is called a writing period Ta1.

On the other hand, the opposing electric potential given to the opposing power source line E1 is kept at the same level of electric potential as the power supply electric potential (OFF opposing electric potential) by the opposing power source line driver circuit 104. This is carried out as the 1 bit digital video signal is inputted to the pixels before the input of the digital video signal to all of the pixels is completed, in other words, before the writing period Ta1 is ended. This brings every EL element whose opposing electrode is connected to the opposing power source line E1 to non-light emission state. Accordingly, every pixel having an EL element whose opposing electrode is connected to the opposing power source line E1 (pixels on the first line) stops displaying.

The period during which the pixels stops displaying is called a non-display period Td. In the pixels on the first line, the display period Tr1 is ended to start a non-display period Td1 as soon as the opposing power source line E1 is given the OFF opposing electric potential to be kept at that potential. Similar to the case of the display periods, a gap of time is set between the starting points of the non-display periods for the respective lines.

While the opposing power source line E1 is kept at the OFF opposing electric potential, the opposing power source line E2 is then given the OFF opposing electric potential to be kept at that potential. As a result, every pixel having an EL is element whose opposing electrode is connected to the opposing power source line E2 (pixels on the second line) is brought into non-display state where the pixel stops displaying.

In this way, the opposing power source lines are sequentially given the OFF opposing electric potential until all of them are kept at the potential. The period required to complete giving all the opposing power source lines E1 to Ey OFF opposing electric potential to keep them at the potential and bringing all pixels that have been displaying upon input of the 1 bit digital signal to non-display state is called an erasing period Te1.

On the other hand, the opposing power source line E1 is again given and kept at the ON opposing electric potential as the pixels are brought into non-display state before all of the opposing power source lines E1 to Ey complete receiving the OFF opposing electric potential and are kept at the potential, in other words, before the erasing period Te1 is ended. Then the gate signal line G1 is selected upon input of the gate signal and the 2 bit digital video signal is inputted to the pixels on the first line. As a result, the pixels on the first line begin to display again, thereby ending the non-display period Td1 and starting a display period Tr2.

In the same manner, the opposing power source lines are sequentially given the ON opposing electric potential until all of them are kept at the potential. Thus the gate signal lines are all sequentially selected, so that the 2 bit digital video signal is inputted to all of the pixels. The period required to complete inputting the 2 bit digital video signal to all of the pixels is called a writing period Ta2.

On the other hand, the opposing power source line E1 is given and kept at the OFF opposing electric potential as the 2 bit digital video signal is inputted to the pixels before the input of the 2 bit digital video signal to all of the pixels is completed, in other words, before the writing period Ta2 is ended. This brings all the EL elements of the pixels on the first line to non-light emission state and the pixels on the first line stop displaying. The display period Tr2 is thus ended to start a non-display period Td2 in the pixels on the first line.

Then the opposing power source lines are sequentially given the OFF electric potential until all of them are kept at the potential. The period required to complete giving all of the opposing power source lines E1 to Ey the OFF electric potential to keep them at the potential and bringing all the pixels that have been displaying upon input of the 2 bit digital video signal to non-display state is called an erasing period Te2.

The operation described above is repeated until the m bit digital video signal is inputted to the pixels, and the display periods Tr and the non-display periods Td start and end again and again during the repetitive operation. The display period Tr1 of the pixels on the respective lines corresponds to a period which starts as the opposing electrodes of the pixels on the respective lines receive the ON opposing electric potential during the writing period Ta1 so that the digital video signal is written into the pixels on the respective lines and which ends as the opposing electrodes of the pixels on the respective lines receive the OFF opposing electric potential during the erasing period Te1. The non-display period Td1 of the pixels on the respective lines corresponds to a period which starts as the opposing electrodes of the pixels on the respective lines receive the OFF opposing electric potential during the erasing period Te1 and which ends as the opposing electrodes of the pixels on the respective lines receive the ON opposing electric potential during the next writing period (the writing period Ta2, in this case) so that the digital video signal is written into the pixels on the respective lines. The length of the display periods Tr2, Tr3, . . . and Tr(m−1) and the non-display periods Td2, Td3, . . . and Td(m−1) are set in a manner similar to the case of the display period Tr1 and the non-display period Td1.

Figure 4:
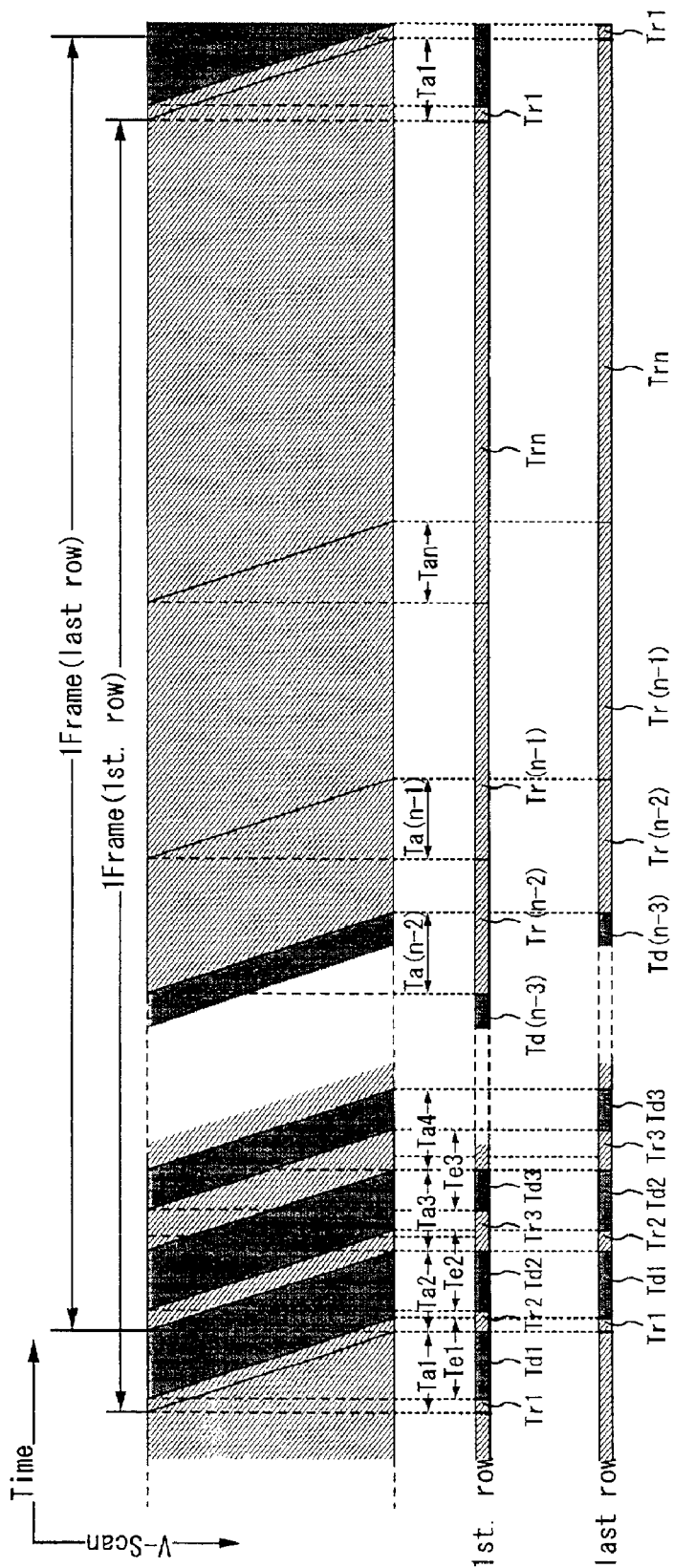
FIG. 4 shows a driving method of the EL display according to the present invention.

An example of a case in which m=n−2 is shown by FIG. 4 in order to make the explanation easy to be understood, but the present invention is of course not limited to this. It is possible to arbitrarily select m from 1 to n with the present invention.

Next, the opposing power source line E1 is given and kept at the ON opposing electric potential and the m [n−2 (hereinafter brackets indicate that it applies to the case where m=n−2)] bit digital video signal is inputted to the pixels on the first line. Thus the pixels on the first line enter a display period Trm [n−2] to begin displaying.

Similarly, the opposing power source lines are sequentially given the ON opposing electric potential until all of them are kept at the potential. Thus the m [n−2] bit digital video signal is inputted to the pixels on all the lines, and the pixels on all the lines enter the display period Trm [n−2] to begin displaying.

The m [n−2] bit digital video signal is held in the pixels until the next bit digital video signal is inputted.

The (m+1) [n−1] bit digital video signal is next inputted to the pixels on the first line while all of the opposing power source lines are kept at the ON opposing electric potential. Then rewriting takes place and the m [n−2] digital video signal held in the pixels are replaced by the (m+1) [n−1] bit digital video signal. The pixels on the first line thus enter a display period Tr (m+1) [n−1] to begin displaying.

Similarly, the opposing power source lines are sequentially given the ON opposing electric potential to be kept at the potential. While all of the opposing power source lines are kept at the ON opposing electric potential, the (m+1) [n−1] bit digital video signal is inputted to the pixels on all the lines. The pixels on all the lines thus enter the display period Tr (m+1) [n−1] to begin displaying.

The (m+1) [n−1] bit digital video signal is held in the pixels until the next bit digital video signal is inputted.

The operation described above is repeated until the n bit digital video signal is inputted to the pixels. The display period Trm [n−2], . . . , Trn of the pixels on the respective lines corresponds to a period which starts as the opposing electrodes of the pixels on the respective lines receive the ON opposing electric potential during the writing period Tam [n−2], . . . , Tan so that the digital video signal is written into the pixels on the respective lines and which ends as the opposing electrodes of the pixels on the respective lines receive the ON opposing electric potential during the next writing period so that the digital video signal is written into the pixels on the respective lines.

One image can be displayed after all of the display periods Tr1 to Trn are completed. A period required to display one image is called one frame period (F) in the present invention. According to the driving method of the present invention, the length of the frame period (F) varies between pixels on one line and pixels on another line. The frame period for the pixels on the y-th line starts with a delay substantially corresponding to the length of the writing period Ta1 from the start of the frame period for the pixels on the first line.

After one frame period is ended, the opposing power source lines E1 to Ey are again kept at the ON opposing electric potential, and the gate signal line G1 is selected upon input of the gate signal. Then the 1 bit digital video signal is inputted to the pixels, so that the pixels on the first line again enter the display period Tr1. The operation described above is thus repeated again.

It is preferable to form 60 or more frame periods every second with a normal EL display device. If the number of images displayed in one second becomes less than 60, image flicker starts to become visually conspicuous.

Further, it is necessary for the sum of the lengths of all of the writing periods to be shorter than one frame period in the present invention. In addition, the length of the display periods must be set so that Tr1:Tr2:Tr3: . . . :Tr(n−1):Trn= $2^0:2^1:2^2: \ldots :2^{(n-2)}:2^{(n-1)}$. The desired gray-scale display can then be performed from among $2^n$ gray scales by combining the display periods.

The length of the gray scale displayed by a pixel during one frame period can be set by finding the total sum of the lengths of the display periods during which the EL element of the pixel emits light during the one frame period. For example, when n=8, if the brightness for a case in which the pixels emit light during all of the display periods is taken as 100%, then a brightness of 1% can be expressed for a case in which the pixels emit light during Tr1 and Tr2. When the pixels emit light in Tr3, Tr5, and Tr8, a brightness of 60% can be expressed.

It is vital that the writing period Tam, in which the number m bit of the digital video signal is written to the pixels, be shorter than the length of the display period Trm. It is necessary, therefore, that the value of the number of bits m be a value, from among 1 to n, at which the writing period Tam is shorter than the length of the display period Trm.

Further, the display periods Tr1 to Trn may appear in any order. For example, it is possible for the display periods to appear such that Tr3, Tr5, Tr2, . . . , follow after Tr1 within one frame period. However, it is preferable that the display periods Tr1 to Trn are in an order at which they do not mutually overlap. Further, it is preferable that the erasing periods Te1 to Ten also are in an order such that they do not mutually overlap.

In accordance with the above structure, even if there is some dispersion in the $I_{DS}$-$V_{GS}$ characteristic of the EL driver TFT when equal gate voltages are applied to the EL driver TFTs can be suppressed with the present invention. Therefore, it becomes possible to avoid a situation, due to the fluctuation of the $I_{DS}$-$V_{GS}$ characteristic, in which the amount of light emitted by the EL elements differs greatly for adjacent pixels even when signals having the same voltage are input.

Non-light emitting periods during which display is not performed can be formed with the present invention. If a completely white image is displayed in an EL display device when using a conventional analog driving method, then the EL elements always emit light and this becomes a cause of quickening EL layer degradation. Non-light emitting periods can be formed with the present invention, and therefore degradation of the EL layers can be suppressed to a certain extent.

Note that portions of the display periods and the writing periods overlap in the present invention. In other words, it is possible to have pixel display even during the writing periods. The ratio of the total sum of the lengths of the display periods in one frame period (duty ratio) is therefore determined only by the lengths of the writing periods.

According to the structure of the present invention, only two transistors consisting of a switching TFT and an EL driver TFT have to be provided in each pixel as in prior art. Therefore the aperture ratio of the pixel is not reduced.

Note that a structure is shown in this embodiment mode in which a capacitor is formed in order to store the voltage applied to the gate electrode of the EL driver TFT, but it is also possible to omit the capacitor. If the EL driver TFT has an LDD region formed so as to overlap with the gate electrode through a gate insulating film, a parasitic capacitance, referred to generally as a gate capacitance, is formed in the overlapping region. This gate capacitance can be actively used as a capacitor in order to store the voltage applied to the gate electrode of the EL driver TFT.

The capacitance value of the gate capacitance changes in accordance with the surface area over which the gate electrode and the LDD region overlap, and is determined by the length of the LDD region contained in the overlapping region.

Note that the above stated structure of the present invention is not limited to EL display applications, and it is also possible to apply the structure of the present invention to devices using other electro-optical elements. Further, if high speed response liquid crystals having a response time equal to or less than 10 μsec are developed, it will also be possible to apply the present invention to liquid crystal displays.

Embodiments of the present invention are explained below.

[Embodiment 1]

Figure 5:
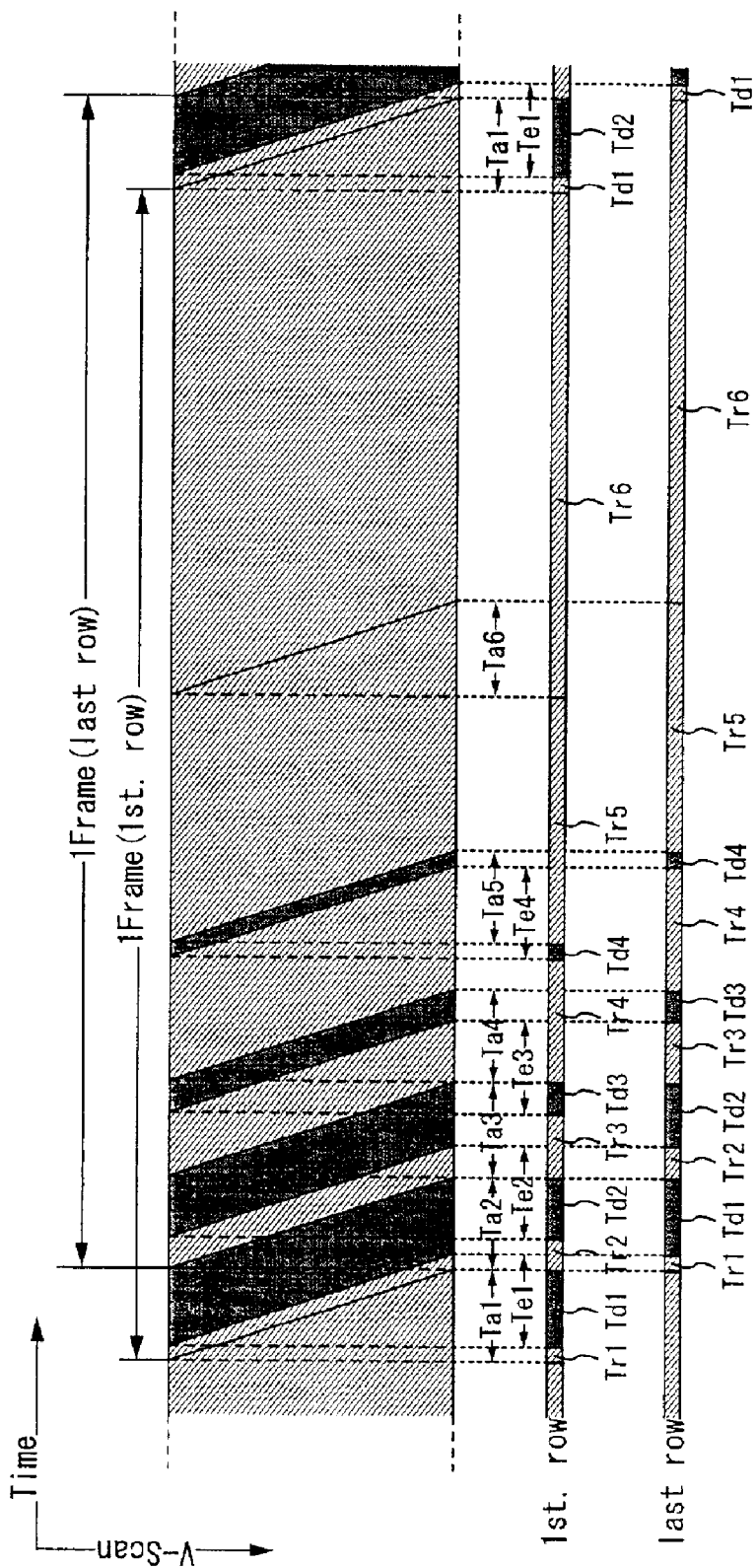
FIG. 5 shows a driving method of the EL display according to the present invention.

A case of performing $2^6$ gray scale display by a 6-bit digital video signal in an EL display of the present invention is explained in Embodiment 1 using FIG. 5. Note that the EL display of Embodiment 1 has the structure shown in FIGS. 1 to 3.

First, the opposing electric potential given to an opposing power source line E1 is kept at an ON opposing electric potential by an opposing electrode power source line driver circuit 104. The ON opposing electric potential refers to an electric potential different from the power supply electric potential to a degree that causes an EL element to emit light when the power supply electric potential is given to a pixel electrode.

The gate signal line G1 then is selected in accordance with a write in gate signal input to the write in gate signal line G1 from the gate signal line driver circuit 103. The switching TFTs 107 of all pixels (the first line of pixels) connected to the write in gate signal line Ga1 are then placed in an ON state.

At the same time, the first bit of a digital video signal input to the source signal lines S1 to Sx from the source signal line driver circuit 102 is input to the gate electrodes of the EL driver TFTs 108 through the switching TFTs 107. The digital video signal is input to the gate electrodes of the EL driver TFTs 108 through the switching TFTs 107.

When the digital video signal has "0" information, the EL driver TFTs 108 are placed in an OFF state in Embodiment 1. The power source electric potential is therefore not imparted to the pixel electrode of the EL elements 110. As a result the EL elements 110 of pixels into which the digital video signals having "0" information are input do not emit light.

Conversely, the EL driver TFTs 108 are placed in an ON state when a digital video signal has "1" information. The power source electric potential is therefore imparted to the pixel electrodes of the EL elements 110. As a result, the EL elements 110 of pixels into which the digital video signals having "1" information are input emit light.

The EL elements 110 perform light emission or do not preform light emission at the same time as the digital video signal is input to the first line of pixels, becoming the display period Tr1. The timing at which the display periods of each line begin have each time differences.

When the gate signal line G1 is selected no longer, the opposing power source line E2 is given and kept at the ON opposing electric potential by the opposing power source line driver circuit 104 while the opposing power source line E1 is kept at the ON opposing electric potential. The gate signal line G2 is selected upon input of the gate signal, so that the switching TFT 107 is turned ON in every pixel that is connected to the gate signal line G2 and the 1 bit digital video signal is inputted from the source signal lines S1 to Sx into the pixels on the second line.

The opposing power source lines are given the opposing electric potential sequentially as above until all of the opposing power source lines E1 to Ex are kept at the opposing electric potential. Thus the gate signal lines G1 to Gy are all sequentially selected, so that the 1 bit digital video signal is inputted to all of the pixels. The period required to input the 1 bit digital video signal into the entire pixels is called a writing period Ta1.

On the other hand, the opposing electric potential given to the opposing power source line E1 is kept at the same level of electric potential as the power supply electric potential (OFF opposing electric potential) by the opposing power source line driver circuit 104. This is carried out as the 1 bit digital video signal is inputted to the pixels before the input of the digital video signal to all of the pixels is completed, in other words, before the writing period Ta1 is ended. This brings every EL element whose opposing electrode is connected to the opposing power source line E1 to non-light emission state. Accordingly, every pixel having an EL element whose opposing electrode is connected to the opposing power source line E1 (pixels on the first line) stops displaying.

The period during which the pixels stops displaying is called a non-display period Td. In the pixels on the first line, the display period Tr1 is ended to start a non-display period Td1 as soon as the opposing power source line E1 is given the OFF opposing electric potential to be kept at that potential. Similar to the case of the display periods, a gap of time is set between the starting points of the non-display periods for the respective lines.

While the opposing power source line E1 is kept at the OFF opposing electric potential, the opposing power source line E2 is then given the OFF opposing electric potential to be kept at that potential. As a result, every pixel having an EL element whose opposing electrode is connected to the opposing power source line E2 (pixels on the second line) is brought into non-display state where the pixel stops displaying.

In this way, the opposing power source lines are sequentially given the OFF opposing electric potential until all of them are kept at the potential. The period required to complete giving all the opposing power source lines E1 to Ey OFF opposing electric potential to keep them at the potential and bringing all pixels that have been displaying upon input of the 1 bit digital signal to non-display state is called an erasing period Te1.

On the other hand, the opposing power source line E1 is again given and kept at the ON opposing electric potential as the pixels are brought into non-display state before all of the opposing power source lines E1 to Ey complete receiving the OFF opposing electric potential and are kept at the potential, in other words, before the erasing period Te1 is ended. Then the gate signal line G1 is selected upon input of the gate signal and the 2 bit digital video signal is inputted to the pixels on the first line. As a result, the pixels on the first line begin to display again, thereby ending the non-display period Td1 and starting a display period Tr2.

In the same manner, the opposing power source lines are sequentially given the ON opposing electric potential until all of them are kept at the potential. Thus the gate signal lines are all sequentially selected, so that the 2 bit digital video signal is inputted to all of the pixels. The period required to complete inputting the 2 bit digital video signal to all of the pixels is called a writing period Ta2.

On the other hand, the opposing power source line E1 is given and kept at the OFF opposing electric potential as the 2 bit digital video signal is inputted to the pixels before the input of the 2 bit digital video signal to all of the pixels is completed, in other words, before the writing period Ta2 is ended. This brings all the EL elements of the pixels on the first line to non-light emission state and the pixels on the first line stop displaying. The display period Tr2 is thus ended to start a non-display period Td2 in the pixels on the first line.

Then the opposing power source lines are sequentially given the OFF electric potential until all of them are kept at the potential. The period required to complete giving all of the opposing power source lines E1 to Ey the OFF electric potential to keep them at the potential and bringing all the pixels that have been displaying upon input of the 2 bit digital video signal to non-display state is called an erasing period Te2.

The operation described above is repeated until the 5 bit digital video signal is inputted to the pixels. The display period Tr1 of the pixels on the respective lines corresponds to a period which starts as the opposing electrodes of the pixels on the respective lines receive the ON opposing electric potential during the writing period Ta1 so that the digital video signal is written into the pixels on the respective lines and which ends as the opposing electrodes of the pixels on the respective lines receive the OFF opposing electric potential during the erasing period Te1. The non-display period Td1 of the pixels on the respective lines corresponds to a period which starts as the opposing electrodes of the pixels on the respective lines receive the OFF opposing electric potential during the erasing period Te1 and which ends as the opposing electrodes of the pixels on the respective lines receive the ON opposing electric potential during the next writing period (the writing period Ta2, in this case) so that the digital video signal is written into the pixels on the respective lines. The length of the display periods Tr2, Tr3, and Tr4 and the non-display periods Td2, Td3, and Td4 are set in a manner similar to the case of the display period Tr1 and the non-display period Td1.

Next, the opposing power source line E1 is given and kept at the ON opposing electric potential and the 5 bit digital video signal is inputted to the pixels on the first line. Thus the pixels on the first line enter a display period Tr5 to begin displaying. The 5 bit digital video signal is held in the pixels until the next bit digital video signal is inputted. Similarly, the opposing power source lines are sequentially given the ON opposing electric potential until all of them are kept at the potential. Thus the 5 bit digital video signal is inputted to the pixels on all the lines, and the pixels on all the lines enter the display period Tr5 to begin displaying.

The 6 bit digital video signal is next inputted to the pixels on the first line while all of the opposing power source lines are kept at the ON opposing electric potential. Then rewriting takes place and the 5 digital video signal held in the pixels are replaced by the 6 bit digital video signal. The pixels on the first line thus enter a display period Tr6 to begin displaying.

The 6 bit digital video signal is held in the pixels until the 1 bit digital video signal of the next frame period is inputted. Similarly, the 6 bit digital video signal is inputted to the pixels on all the lines. The pixels on all the lines thus enter the display period Tr6 to begin displaying.

The 1 bit digital video signal is again inputted to the pixels to start the next frame period, thereby ending the display period Tr 6 and simultaneously ending the current frame period. One image can be displayed upon completion of one frame period, which coincides with completion of all the display periods (Tr1 to Tr 6). The above operation is repeated in the next frame period.

The display period Tr5 of the pixels on the respective lines corresponds to a period which starts as the opposing electrodes of the pixels on the respective lines receive the ON opposing electric potential so that the digital video signal is written into the pixels on the respective lines and which ends as the opposing electrodes of the pixels on the respective lines receive the ON opposing electric potential during the next writing period (the writing period Ta6, in this case). The display period Tr6 of the pixels on the respective lines corresponds to a period which starts as the opposing electrodes of the pixels on the respective lines receive the ON opposing electric potential so that the digital video signal is written into the pixels on the respective lines and which ends as the opposing electrodes of the pixels on the respective lines receive the ON opposing electric potential during the next writing period (the writing period Ta1 of the next frame period, in this case) so that the digital video signal is written into the pixels on the respective lines.

The length of the display periods Tr must be set so that Tr1:Tr2:Tr3: . . . :Tr5:Tr6=$2^0$:$2^1$: . . . :$2^4$:$2^5$. The desired gray-scale display can then be performed from among $2^6$ gray scales by combining the display periods.

The length of the gray scale displayed by a pixel during one frame period can be set by finding the total sum of the lengths of the display periods during which the EL element of the pixel emits light during the one frame period. For example if the brightness for a case in which the pixels emit light during all of the display periods is taken as 100%, then a brightness of 5% can be expressed for a case in which the pixels emit light during Tr1 and Tr2. When the pixels emit light in Tr3 and Tr5 a brightness of 32% can be expressed.

In Embodiment 1, it is vital that the writing period Ta5, in which the number 5 bit of the digital video signal is written to the pixels, be shorter than the length of the display period Tr5.

Further, the display periods Tr1 to Tr6 may appear in any order. For example, it is possible for the display periods to appear such that Tr3, Tr5, Tr2, . . . , follow after Tr1 within one frame period. However, it is preferable that the erasing periods Te1 to Te6 are in an order at which they do not mutually overlap. Further, it is preferable that the display periods Tr1 to Tr6 also are in an order such that they do not mutually overlap.

In accordance with the above structure, even if there is some dispersion in the $I_{DS}$-$V_{GS}$ characteristic of the EL driver TFT, when equal gate voltages are applied to the EL driver TFTs can be suppressed with the present invention. Therefore, it becomes possible to avoid a situation, due to the fluctuation of the $I_{DS}$-$V_{GS}$ characteristic, in which the amount of light emitted by the EL elements differs greatly for adjacent pixels even when signals having the same voltage are input.

Non-light emitting periods during which display is not performed can be formed with the present invention. If a completely white image is displayed in an EL display device when using a conventional analog driving method, then the EL elements always emit light and this becomes a cause of quickening EL layer degradation. Non-light emitting periods can be formed with the present invention, and therefore degradation of the EL layers can be suppressed to a certain extent.

[Embodiment 2]

The order of appearance of the display periods Tr1 to Tr6 in a driving method of the present invention corresponding to a 6-bit digital video signal is explained in Embodiment 2.

Figure 6:
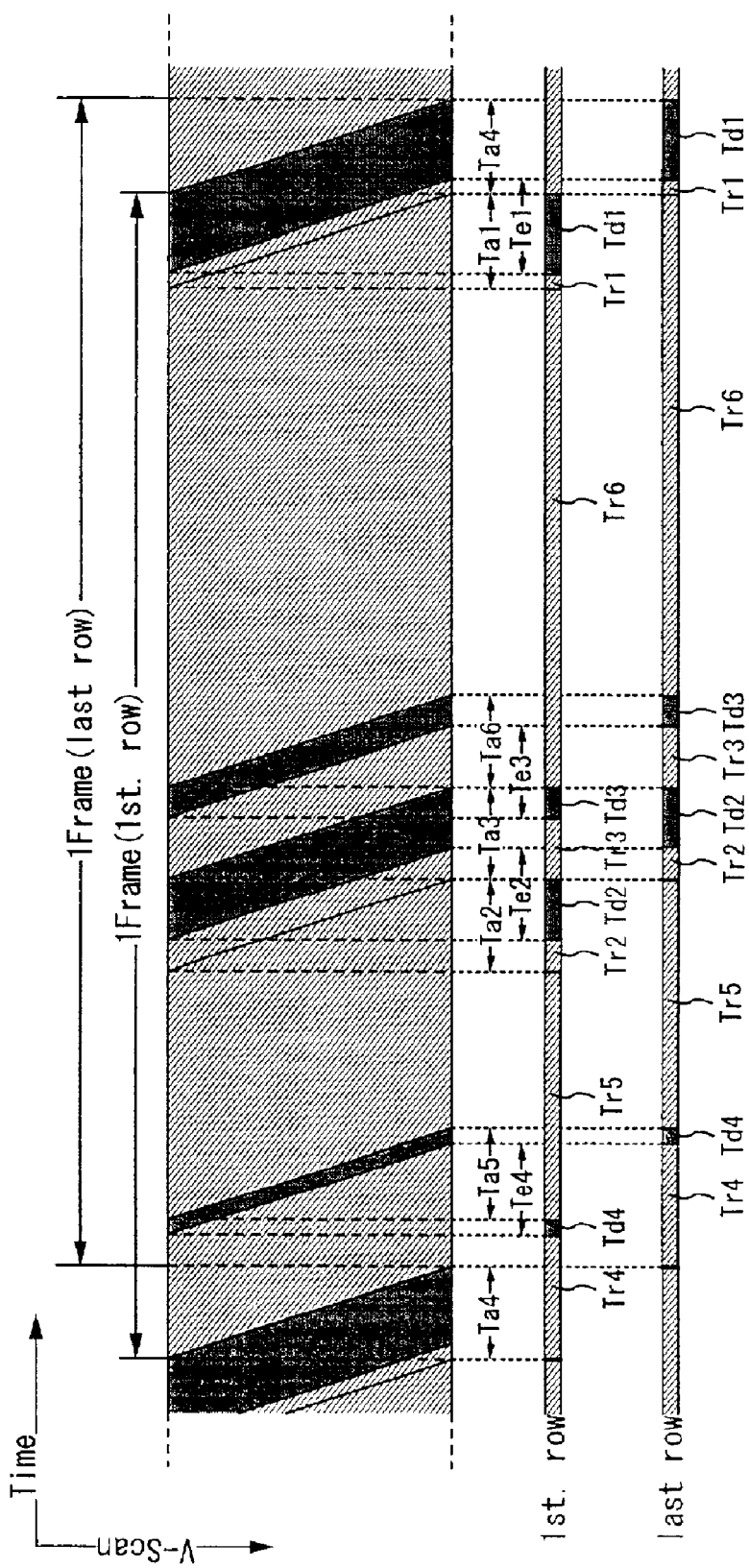
FIG. 6 shows a driving method of the EL display according to the present invention.

FIG. 6 shows a timing chart for the driving method of Embodiment 2. FIG. 1 may be referred to for detailed drive of the pixels, and therefore this explanation is omitted here. The longest non-display period (Td1 in Embodiment 2) within one frame period is formed at the end of the one frame period with the driving method of Embodiment 2. It appears to human eyes that there is a separation between the non-display period Td1 and the first display period (Tr4 in Embodiment 2) of the next frame period in accordance with the above structure. Unevenness of display arising due to display periods for emitting light adjoining between adjacent frame periods can thus be made more difficult for human eyes to recognize.

Note that, although a case of a 6-bit digital video signal is explained in Embodiment 2, the present invention is not limited to this. It is possible to implement Embodiment 2 without limiting the number of bits of the digital video signal.

[Embodiment 3]

Figure 7:
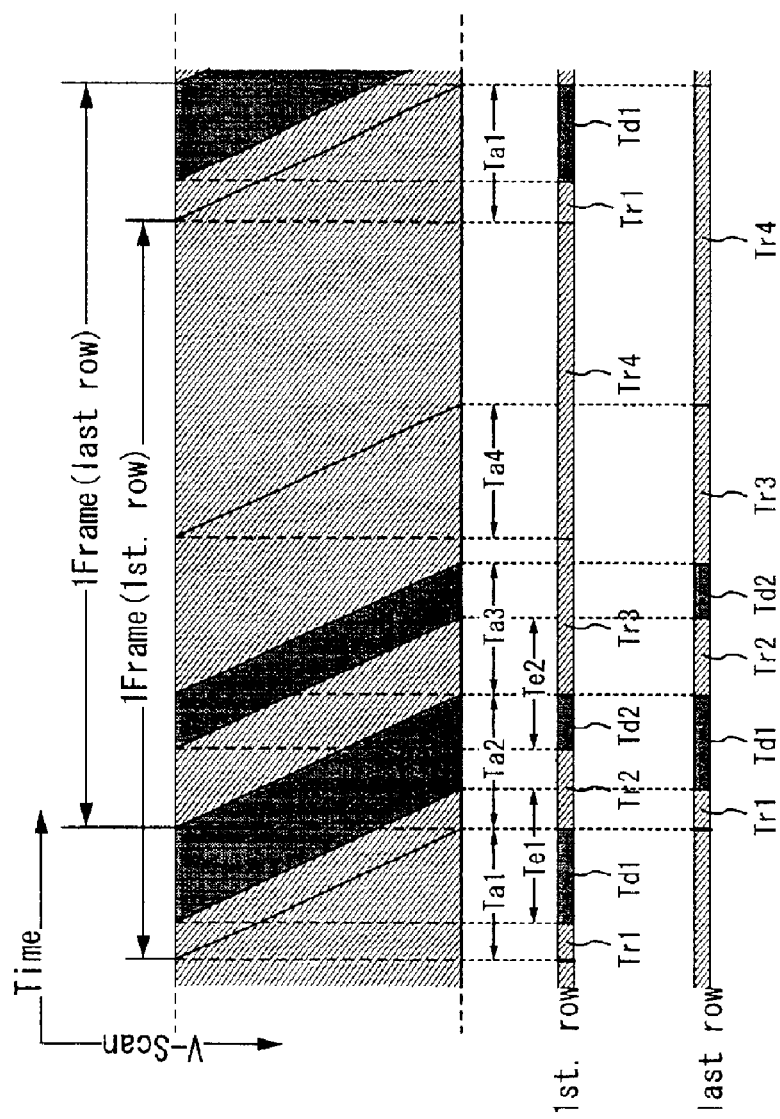
FIG. 7 shows a driving method of the EL display according to the present invention.

A case of performing $2^4$ bit gray scale display in an EL display of the present invention, in accordance with a 4-bit digital video signal, is explained in Embodiment 3 using FIG. 7. Note that the EL display of Embodiment 3 has the structure shown in FIGS. 1 to 3.

First, the opposing electric potential given to the opposing power source line E1 is kept at an ON opposing electric potential by the opposing electrode power source line driver circuit 104. The ON opposing electric potential refers to an electric potential different from the power supply electric potential to a degree that causes the EL element to emit light when the power supply electric potential is given to the pixel electrode.

Then the gate signal line G1 is selected upon input of a gate signal inputted to the gate signal line G1 from the gate signal line driver circuit 103. As a result, the switching TFT 107 is turned ON in every pixel that is connected to the gate signal line G1 (pixels on the first line).

At the same time, the first bit of a digital video signal input to the source signal lines S1 to Sx from the source signal line driver circuit 102 is input to the gate electrodes of the EL driver TFTs 108 through the switching TFTs 107. The digital video signal is input to the gate electrodes of the EL driver TFTs 108 through the switching TFTs 107.

When the digital video signal has "0" information, the EL driver TFTs 108 are placed in an OFF state in Emobodiment 3. The power source electric potential is therefore not imparted to the pixel electrode of the EL elements 110. As a result, the EL elements 110 of pixels into which the digital video signals having "0" information are input do not emit light.

Conversely, the EL driver TFTs 108 are placed in an ON state when a digital video signal has "1" information. The power source electric potential is therefore imparted to the pixel electrodes of the EL elements 110. As a result, the EL elements 110 of pixels into which the digital video signals having "1" information are input emit light.

In Embodiment 3, in the case where the digital video signal has information of "0", the EL driver TFT 108 is turned OFF, and in the case where the digital video signal has information of "1", the EL driver TFT 108 is turned ON. However, the present invention is not limited to such a structure. Alternatively, the EL driver TFT 108 may be turned ON with the digital video signal having information of "0", and the EL driver TFT 108 may be turned OFF with the digital video signal having information of "1".

In this way, simultaneously with the input of the digital video signal of the first bit of pixels, the EL elements 110 are brought into a light emitting state or a non-light emitting state so that the pixels on the first line perform display. A period during which pixels perform display is referred to as a display period Tr. The timing at which the display period of each line starts has a time difference, respectively.

When the gate signal line G1 is selected no longer, the opposing power source line E2 is given and kept at the ON opposing electric potential by the opposing power source line driver circuit 104 while the opposing power source line E1 is kept at the ON opposing electric potential. The gate signal line G2 is selected upon input of the gate signal, so that the switching TFT 107 is turned ON in every pixel that is connected to the gate signal line G2 and the 1 bit digital video signal is inputted from the source signal lines S1 to Sx into the pixels on the second line.

The opposing power source lines are given the opposing electric potential sequentially as above until all of the opposing power source lines E1 to Ex are kept at the opposing electric potential. Thus the gate signal lines G1 to Gy are all sequentially selected, so that the 1 bit digital video signal is inputted to all of the pixels. The period required to input the 1 bit digital video signal into the entire pixels is called a writing period Ta1.

On the other hand, the opposing electric potential given to the opposing power source line E1 is kept at the same level of electric potential as the power supply electric potential (OFF opposing electric potential) by the opposing power source line driver circuit 104. This is carried out as the 1 bit digital video signal is inputted to the pixels before the input of the digital video signal to all of the pixels is completed, in other words, before the writing period Ta1 is ended. This brings every EL element whose opposing electrode is connected to the opposing power source line E1 to non-light emission state. Accordingly, every pixel having an EL element whose opposing electrode is connected to the opposing power source line E1 (pixels on the first line) stops displaying.

The period during which the pixels stops displaying is called a non-display period Td. In the pixels on the first line, the display period Tr1 is ended to start a non-display period Td1 as soon as the opposing power source line E1 is given the OFF opposing electric potential to be kept at that potential. Similar to the case of the display periods, a gap of time is set between the starting points of the non-display periods for the respective lines.

While the opposing power source line E1 is kept at the OFF opposing electric potential, the opposing power source line E2 is then given the OFF opposing electric potential to be kept at that potential. As a result, every pixel having an EL element whose opposing electrode is connected to the opposing power source line E2 (pixels on the second line) is brought into non-display state where the pixel stops displaying.

In this way, the opposing power source lines are sequentially given the OFF opposing electric potential until all of them are kept at the potential. The period required to complete giving all the opposing power source lines E1 to Ey OFF opposing electric potential to keep them at the potential and bringing all pixels that have been displaying upon input of the 1 bit digital signal to non-display state is called an erasing period Te1.

On the other hand, the opposing power source line E1 is again given and kept at the ON opposing electric potential as the pixels are brought into non-display state before all of the opposing power source lines E1 to Ey complete receiving the OFF opposing electric potential and are kept at the potential, in other words, before the erasing period Te1 is ended. Then the gate signal line G1 is selected upon input of the gate signal and the 2 bit digital video signal is inputted to the pixels on the first line. As a result, the pixels on the first line begin to display again, thereby ending the non-display period Td1 and starting a display period Tr2.

In the same manner, the opposing power source lines are sequentially given the ON opposing electric potential until all of them are kept at the potential. Thus the gate signal lines are all sequentially selected, so that the 2 bit digital video signal is inputted to all of the pixels. The period required to complete inputting the 2 bit digital video signal to all of the pixels is called a writing period Ta2.

On the other hand, the opposing power source line E1 is given and kept at the OFF opposing electric potential as the 2 bit digital video signal is inputted to the pixels before the input of the 2 bit digital video signal to all of the pixels is completed, in other words, before the writing period Ta2 is ended. This brings all the EL elements of the pixels on the first line to non-light emission state and the pixels on the first line stop displaying. The display period Tr2 is thus ended to start a non-display period Td2 in the pixels on the first line.

Then the opposing power source lines are sequentially given the OFF electric potential until all of them are kept at the potential. The period required to complete giving all of the opposing power source lines E1 to Ey the OFF electric potential to keep them at the potential and bringing all the pixels that have been displaying upon input of the 2 bit digital video signal to non-display state is called an erasing period Te2.

The display period Tr1 of the pixels on the respective lines corresponds to a period which starts as the opposing electrodes of the pixels on the respective lines receive the ON opposing electric potential during the writing period Ta1 so that the digital video signal is written into the pixels on the respective lines and which ends as the opposing electrodes of the pixels on the respective lines receive the OFF opposing electric potential during the erasing period Te1. The non-display period Td1 of the pixels on the respective lines corresponds to a period which starts as the opposing electrodes of the pixels on the respective lines receive the OFF opposing electric potential during the erasing period Te1 and which ends as the opposing electrodes of the pixels on the respective lines receive the ON opposing electric potential during the next writing period (the writing period Ta2, in this case) so that the digital video signal is written into the pixels on the respective lines. The length of the display period Tr2 and the non-display period Td2 are set in a manner similar to the case of the display period Tr1 and the non-display period Td1.

Next, the opposing power source line E1 is given and kept at the ON opposing electric potential and the 3 bit digital video signal is inputted to the pixels on the first line. Thus the pixels on the first line enter a display period Tr3 to begin displaying. Similarly, the opposing power source lines are sequentially given the ON opposing electric potential until all of them are kept at the potential. Then, the 3 bit digital video signal is inputted to the pixels on all the lines, and the pixels on all the lines enter the display period Tr3 to begin displaying. The 3 bit digital video signal is held in the pixels until the next bit digital video signal is inputted.

Next, the 4 bit digital video signal is inputted to the pixels on the first line while all the opposing power source lines are kept at the ON opposing electric potential. Thus rewriting takes place and the 3 bit digital video signal that has been held in the pixels is replaced by the 4 bit digital video signal. The pixels on the first line then enter the display period Tr4 to begin displaying. Similarly, the opposing power source lines are all sequentially given the ON opposing electric potential. While all of the opposing power source lines are kept at the ON opposing electric potential, the 4 bit digital video signal is inputted to the pixels on all the lines, and the pixels on all the lines enter the display period Tr4 to begin displaying. The 4 bit digital video signal is held in the pixels until the 1 bit digital video signal is again inputted in the next frame period.

The 1 bit digital video signal is again inputted to the pixels to start the next frame period, thereby ending the display period Tr 4 and simultaneously ending the current frame period. One image can be displayed upon completion of all the display periods (Tr1 to Tr 4). The above operation is repeated in the next frame period.

The display period Tr3 of the pixels on the respective lines corresponds to a period which starts as the opposing electrodes of the pixels on the respective lines receive the ON opposing electric potential so that the digital video signal is written into the pixels on the respective lines and which ends as the opposing electrodes of the pixels on the respective lines receive the ON opposing electric potential during the next writing period (the writing period Ta4, in this case). The display period Tr4 of the pixels on the respective lines corresponds to a period which starts as the opposing electrodes of the pixels on the respective lines receive the ON opposing electric potential so that the digital video signal is written into the pixels on the respective lines and which ends as the opposing electrodes of the pixels on the respective lines receive the ON opposing electric potential during the next writing period (the writing period Ta1 of the next frame period, in this case) so that the digital video signal is written into the pixels on the respective lines.

The length of the display periods Tr is set so that Tr1:Tr2:Tr3:Tr4=$2^0$:$2^1$:$2^2$:$2^3$. The desired gray scale display can be performed from among the $2^4$ gray scales by combining the display periods.

The length of the gray scale displayed by a pixel during one frame period can be set by finding the total sum of the lengths of the display periods during which the EL element of the pixel emits light during the one frame period. For example, if the brightness for a case in which the pixels emit light during all of the display periods is taken as 100%, then a brightness of 20% can be expressed for a case in which the pixels emit light during Tr1 and Tr2. If the pixels emit light only in Tr3, a brightness of 27% can be expressed.

In Embodiment 3, it is vital that the write period Ta3, in which the third bit of the digital video signal is written into the pixels, be shorter than the length of the display period Tr3.

Further, the display periods Tr1 to Tr4 may appear in any order. For example, it is possible for the display periods to appear such that Tr3, Tr4, Tr2 follow after Tr1 within one frame period. However, it is preferable that the erasing periods Te1 to Te4 also have an order such that they do not mutually overlap. Further, it is preferable that the display periods Tr1 to Tr4 have an order at which they do not mutually overlap.

In accordance with the above structure, even if there is some dispersion in the $I_{DS}$-$V_{GS}$ characteristic of the TFT, it becomes possible to avoid a situation in which, the amount of light emitted by the EL elements differs greatly for adjacent pixels when signals having the same voltage are inputted.

Non-light emitting periods during which display is not performed can be formed with the present invention. If a completely white image is displayed in an EL display device when using a conventional analog driving method, then the EL elements always emit light and this becomes a cause of quickening EL layer degradation. Non-light emitting periods can be formed with the present invention, and therefore degradation of the EL layers can be suppressed to a certain extent.

Note that it is possible to implement Embodiment 3 in combination with Embodiment 2.

[Embodiment 4]

A top surface diagram (FIGS. 8A and 8B) of the EL display of the present invention shown in FIG. 3 is explained in Embodiment 4. Common reference numerals are used in FIG. 3 and FIGS. 8A and 8B, and therefore both figures may be mutually referenced.

Figure 8A:
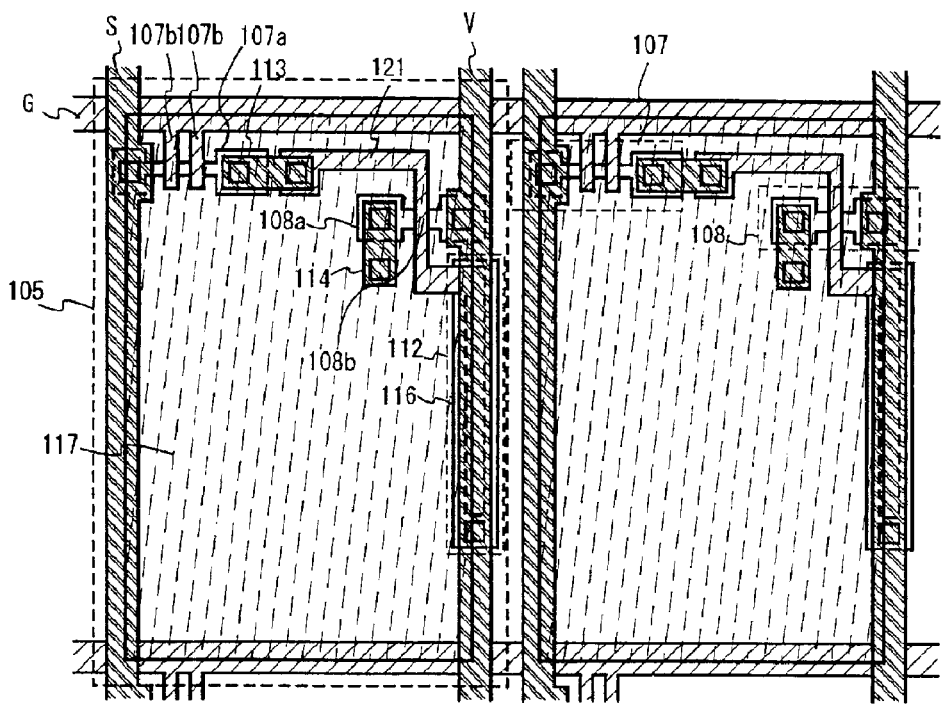
FIGS. 8A and 8B are top views of the pixel of the EL display according to the present invention.

The pixel 105 has the switching TFT 107 and the EL driver TFT 108 in FIG. 8A.

The switching TFT 107 has an active layer 107a and a gate electrode 107b which is a portion of the gate signal line G. The EL driver TFT 108 has an active layer 108a and a gate electrode 108b which is a portion of a gate wiring 121.

One of a source region and a drain region of the active layer 107a of the switching TFT 107 is connected to the source signal line S, and the other of the source region and the drain region is connected to the gate wiring 121 through a connection wiring 113. Note that the connection wiring 113 is referred to as a source wiring, and as a drain wiring, depending on the power source electric potential of the power source signal line S.

A source region and a drain region of the active layer 108a of the EL driver TFT 108 are connected to the power source supply line V and to a drain wiring 114, respectively. The drain wiring 114 is connected to a pixel electrode 117.

A capacitor wiring 116 is formed by a semiconductor film. The capacitor 112 is formed by the capacitor wiring 116, which is electrically connected to the electric power supply line V, and between an insulating film (not shown in the figures) on the same layer as the gate insulating film and the gate wiring 121. Further, it is also possible to use a capacitance formed by the gate wiring 121, a layer (not shown in the figures) which is the same as the first interlayer insulating film, and the power source supply line V.

Figure 8B:
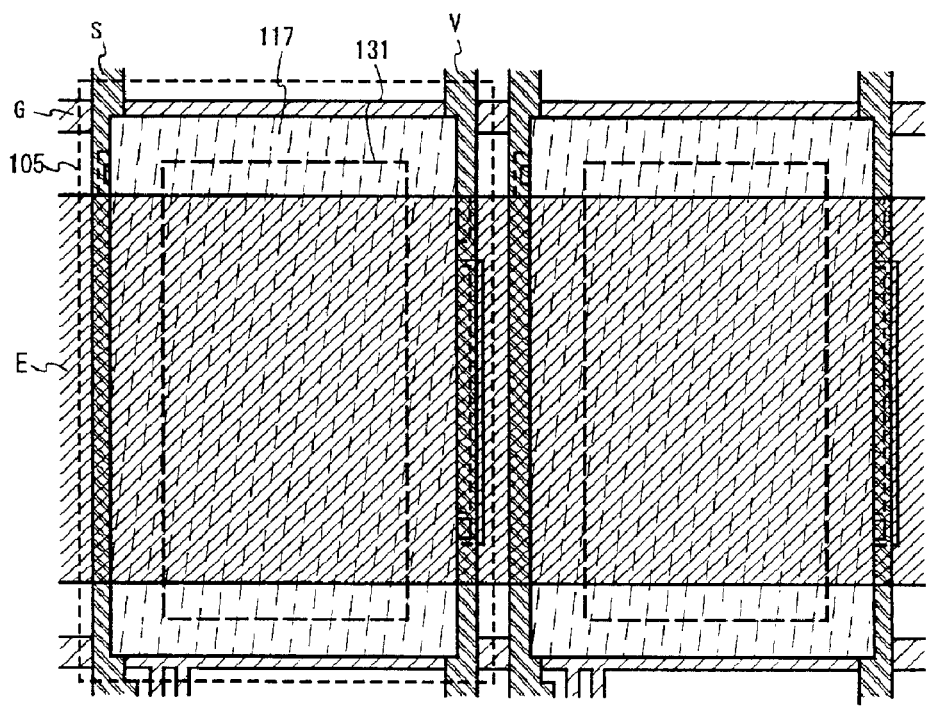

Note that a bank having a formed opening 131, is formed on the pixel electrode 117 by etching an organic resin film (FIG. 8B). The EL layers and the opposing power source line E including the opposing electrode are then laminated in order on the pixel electrode 117, although not shown in the figure. The pixel electrode 105 and the EL layer contact in the open portion 131 of the bank, and the EL layer emits light only in a portion sandwiched by the contacting opposing power source line E and pixel electrode.

A pixel corresponds to a region 105 that has one source signal line (S), one power source supply line (V), one gate signal line (G) and one opposing power source line (E). Note that the top surface of the pixel portion of the EL display of the present invention is not limited to the structures shown in FIGS. 8A and 8B.

It is possible to implement Embodiment 4 in combination with Embodiments 1 to 3.

[Embodiment 5]

Figure 9:
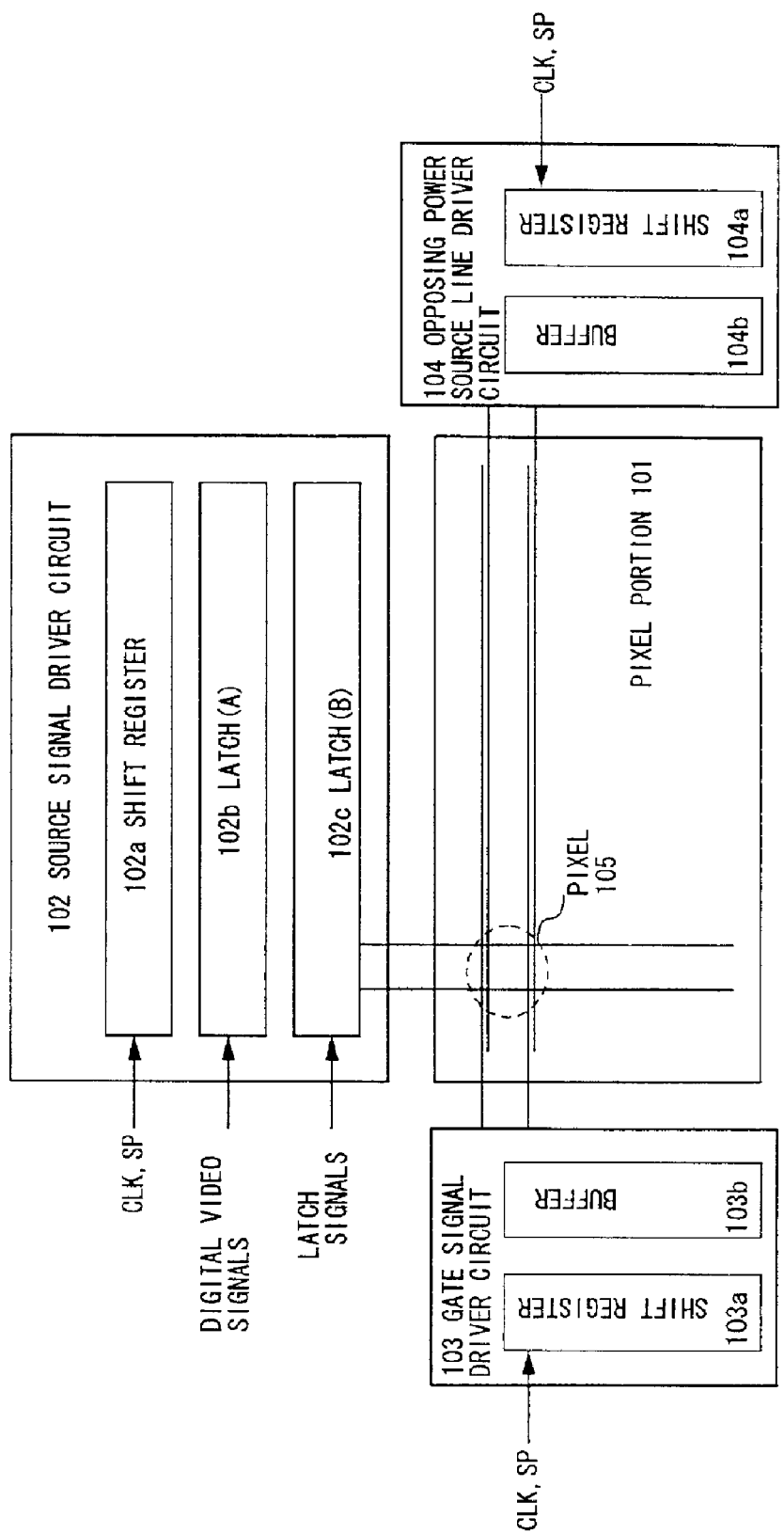
FIG. 9 is a block diagram showing a structure of a driver circuit of the EL display according to the present invention.

A detailed structure of the driver circuit of the EL display of the present invention shown by FIG. 1 is explained in Embodiment 5 using FIG. 9.

The source signal line driver 102 has a shift register 102a, a latch(A) (the first latch) 102b, and a latch(B) (the second latch) 102c.

A clock signal CLK and a start pulse SP are input to the shift register 102a in the source signal line driver circuit 102. The shift register 102a generates timing signals in order based upon the clock signal CLK and the start pulse SP, and supplies the timing signals one after another to the latch(A) 102b.

Note that, although not shown in the figure, the timing signals output from the shift register circuit 102a may be buffer amplified by a circuit such as a buffer (not shown in the figure) and then input to the latch(A) 102b, which is a downstream circuit. The load capacitance (parasitic capacitance) of a wiring which supplies the timing signals is large because many of the circuits or elements are connected to the wiring. The buffer is formed in order to prevent bluntness in the rise and fall of the timing signal, generated due to the large load capacitance.

The latch(A) 102b has a plurality of latch stages for processing n-bit digital video signals. The latch(A) 102b writes in and maintains the n-bit digital video signal, input from external to the source signal line driver circuit 102, when the timing signal is input.

Note that the digital video signal may also be input in order to the plurality of latch stages of the latch(A) 102b when writing in the digital video signal to the latch(A) 102b. However, the present invention is not limited to this structure. The plurality of latch stages of the latch(A) 102b may be divided into a number of groups, and the digital video signal may be input to the respective groups at the same time in parallel, performing partitioned driving. For example, this is referred to as gray scale drive with 4 divisions when the latches are divided into groups every four stages.

The period until the digital video signal is completely written into all of the latch stages of the latch(A) 102b is referred to as a line period. Namely, the line period begins at the point when the digital video signal is written into the leftmost stage latch within the latch(A) 102b, and is completed when the digital video signal is written into is the rightmost stage latch. In practice, there are times when the line period includes the addition of a horizontal blanking period to the above line period.

A latch signal is supplied to the latch(B) 102c when one line period is completed. The digital video signal written into and stored in the latch(A) 102b is sent all at once at this instant to the latch(B) 102c, is written into all of the stage latches of the latch(B) 102c, and is stored.

Write in of the digital video signal input from the external of the source signal line driver circuit 102 is again performed, in order, to the latch(A) 102b after it has completed sending the digital video signal to the latch(B) 102c, based on the timing signal from the shift register 102a.

The digital video signal written into and stored in the latch(B) 102c is inputted to source signal lines during the second one line period.

On the other hand, the gate signal line driver circuit 103 has a shift register 103a and a buffer 103b. Further, the gate signal line driver circuit 103 may also have a level shifter in addition to the shift register 103a and the buffer 103b, depending upon the circumstances.

The opposing power source line driver circuit 104 has a shift register 104a and a buffer 104b. Further, the opposing power source line driver circuit 104 may also have a level shifter in addition to the shift register 104a and the buffer 104b, depending upon the circumstances.

A timing signal from the shift register 103a and 104a is supplied to the buffer (not shown in the figure), and is supplied to the corresponding gate signal line and the opposing power source line respectively, in the gate signal line driver circuit 103 and the opposing power source line driver circuit 104.

The gate electrodes of the pixel TFTs for one line portion of pixels are connected to the gate signal lines, and the pixel TFTs of all of the one line portion of pixels must be placed in an ON state simultaneously. A circuit capable of handling the flow of a large electric current is therefore used for the buffer 103b. Further, an opposing power supply line includes opposing electrodes for one line portion of pixels, and an ON opposing electric potential or an OFF opposing electric potential must be imparted to the opposing electrodes of all of the one line portion of pixels simultaneously. A circuit capable of handling the flow of a large electric current is therefore used for the buffer 104b.

Note that it is possible to implement Embodiment 5 in combination with Embodiments 1 to 4.

[Embodiment 6]

In Embodiment 6, a method of simultaneously manufacturing TFTs of a pixel portion of an EL display of the present invention and driver circuit portions provided in the periphery thereof (a source signal line driver circuit, a gate signal line driver circuit and an opposing power source line driver circuit). However, in order to simplify the explanation, a CMOS circuit, which is the basic circuit for the driver circuit, is shown in the figures.

First, as shown in FIG. 10A, a base film 5002 made of an insulating film such as a silicon oxide film, a silicon nitride film, or a silicon nitride oxide film is formed on a substrate 5001 made of glass such as barium borosilicate glass or alumino borosilicate glass, typified by #7059 glass or #1737 glass of Corning Inc. For example, a silicon nitride oxide film 5002a fabricated from $SiH_4$, $NH_3$ and $N_2O$ by a plasma CVD method is formed with a thickness of 10 to 200 nm (preferably 50 to 100 nm), and a hydrogenated silicon nitride oxide film 5002b similarly fabricated from $SiH_4$ and $N_2O$ is formed with a thickness of 50 to 200 nm (preferably 100 to 150 nm) to form a lamination. In Embodiment 6, although the base film 5002 is shown as the two-layer structure, the film may be formed of a single layer film of the foregoing insulating film or as a lamination structure of more than two layers.

Island-like semiconductor films 5003 to 5006 are formed of a crystalline semiconductor film manufactured by using a laser crystallization method on a semiconductor film having an amorphous structure, or by using a known thermal crystallization method. The thickness of the island-like semiconductor films 5003 to 5006 is set from 25 to 80 nm (preferably between 30 and 60 nm). There is no limitation on the crystalline semiconductor film material, but it is preferable to form the film from a silicon or a silicon germanium (SiGe) alloy.

A laser such as a pulse oscillation type or continuous emission type excimer laser, a YAG laser, or a $YVO_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 300 Hz, and the laser energy density is set from 100 to 400 $mJ/cm^2$ (typically between 200 and 300 $mJ/cm^2$) when using the excimer laser. Further, the second harmonic is utilized when using the YAG laser, the pulse oscillation frequency is set from 30 to 300 kHz, and the laser energy density may be set from 300 to 600 $mJ/cm^2$ (typically between 350 and 500 $mJ/cm^2$). The laser light which has been condensed into a linear shape with a width of 100 to 1000 μm, for example 400 μm, is then irradiated over the entire surface of the substrate. This is performed with an overlap ratio of 80 to 98% in case of the excimer laser and 50 to 90% in case of the YAG laser.

Next, a gate insulating film 5007 is formed covering the island-like semiconductor films 5003 to 5006. The gate insulating film 5007 is formed of an insulating film containing silicon with a thickness of 40 to 150 nm by a plasma CVD method or a sputtering method. A 120 nm thick silicon nitride oxide film is formed in Embodiment 6. The gate insulating film 5007 is not limited to such a silicon nitride oxide film, of course, and other insulating films containing silicon may also be used, in a single layer or in a lamination structure. For example, when using a silicon oxide film, it can be formed by the plasma CVD method with a mixture of TEOS (tetraethyl orthosilicate) and $O_2$, at a reaction pressure of 40 Pa, with the substrate temperature set from 300 to 400° C., and by discharging at a high frequency (13.56 MHz) with electric power density of 0.5 to 0.8 $W/cm^2$. Good characteristics of the silicon oxide film thus manufactured as a gate insulating film can be obtained by subsequently performing thermal annealing at 400 to 500° C.

A first conductive film 5008 and a second conductive film 5009 are then formed on the gate insulating film 5007 in order to form gate electrodes. In Embodiment 6, the first conductive film 5008 is formed from Ta with a thickness of 50 to 100 nm, and the second conductive film 5009 is formed from W with a thickness of 100 to 300 nm.

The Ta film is formed by sputtering, and sputtering of a Ta target is performed by using Ar. If an appropriate amount of Xe or Kr is added to the Ar during sputtering, the internal stress of the Ta film will be relaxed, and film peeling can be prevented. The resistivity of an α phase Ta film is on the order of 20 μΩcm, and the Ta film can be used for the gate electrode, but the resistivity of a β phase Ta film is on the order of 180 μΩcm and the Ta film is unsuitable for the gate electrode. The α phase Ta film can easily be obtained if a tantalum nitride film, which possesses a crystal structure near that of α phase Ta, is formed with a thickness of 10 to 50 nm as a base for Ta in order to form the α phase Ta film.

The W film is formed by sputtering with W as a target. The W film can also be formed by a thermal CVD method using tungsten hexafluoride ($WF_6$). Whichever is used, it is necessary to make the film low resistant in order to use it as the gate electrode, and it is preferable that the resistivity of the W film be set 20 μΩcm or less. The resistivity can be lowered by enlarging the crystals of the W film, but for cases where there are many impurity elements such as oxygen within the W film, crystallization is inhibited, and the film becomes high resistant. A W target having a purity of 99.9999% or 99.99% is thus used in sputtering. In addition, by forming the W film while taking sufficient care such that no impurities from the inside of the gas phase are introduced at the time of film formation, a resistivity of 9 to 20 μΩcm can be achieved.

Note that although the first conductive film 5008 and the second conductive film 5009 are formed from Ta and W, respectively, in Embodiment 6, the conductive films are not limited to these. Both the first conductive film 5008 and the second conductive film 5009 may also be formed from an element selected from the group consisting of Ta, W, Ti, Mo, Al, and Cu, or from an alloy material or a chemical compound material having one of these elements as its main constituent. Further, a semiconductor film, typically a polysilicon film, into which an impurity element such as phosphorous is doped, may also be used. Examples of preferable combinations other than that in Embodiment 6 include: the first conductive film formed from tantalum nitride (TaN) and the second conductive film formed from W; the first conductive film formed from tantalum nitride (TaN) and the second conductive film formed from Al; and the first conductive film formed from tantalum nitride (TaN) and the second conductive film formed from Cu.

Next, a mask 5010 is formed from resist, and a first etching process is performed in order to form electrodes and wirings. An ICP (inductively coupled plasma) etching method is used in Embodiment 6. A gas mixture of $CF_4$ and $Cl_2$ is used as an etching gas, and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. The W film and the Ta film are both etched on the same order when $CF_4$ and $Cl_2$ are mixed.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 0 to 20% in order to perform etching without any residue on the gate insulating film. The selectivity of a silicon nitride oxide film with respect to a W film is from 2 to 4 (typically 3), and therefore approximately 20 to 50 nm of the exposed surface of the silicon nitride oxide film is etched by this over-etching process. First shape conductive layers 5011 to 5016 (first conductive layers 5011a to 5016a and second conductive layers 5011b to 5016b) are thus formed of the first conductive layer and the second conductive layer by the first etching process. At this point, regions of the gate insulating film 5007 not covered by the first shape conductive layers 5011 to 5016 are made thinner by approximately 20 to 50 nm by etching. (FIG. 10A)

Then, a first doping process is performed to add an impurity element for imparting a n-type conductivity. (FIG. 10B) Doping may be carried out by an ion is doping method or an ion injecting method. The condition of the ion doping method is that a dosage is $1 \times 10^{13}$ to $5 \times 10^4$ atoms/$cm^2$, and an acceleration voltage is 60 to 100 keV. As the impurity element for imparting the n-type conductivity, an element belonging to group 15, typically phosphorus (P) or arsenic (As) is used, but phosphorus is used here. In this case, the conductive layers 5011 to 5015 become masks to the impurity element to impart the n-type conductivity, and first impurity regions 5017 to 5025 are formed in a self-aligning manner. The impurity element to impart the n-type conductivity in the concentration range of $1\times10^{20}$ to $1\times10^{21}$ atoms/cm$^3$ is added to the first impurity regions 5017 to 5025.

Next, as shown in FIG. 10C, a second etching process is performed without removing the mask formed from resist. The etching gas of the mixture of $CF_4$, $Cl_2$ and $O_2$ is used, and the W film is selectively etched. At this point, second shape conductive layers 5026 to 5031 (first conductive layers 5026a to 5031a and second conductive layers 5026b to 5031b) are formed by the second etching process. Regions of the gate insulating film 5007, which are not covered with the second shape conductive layers 5026 to 5031 are made thinner by about 20 to 50 nm by etching.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Figure 11A:
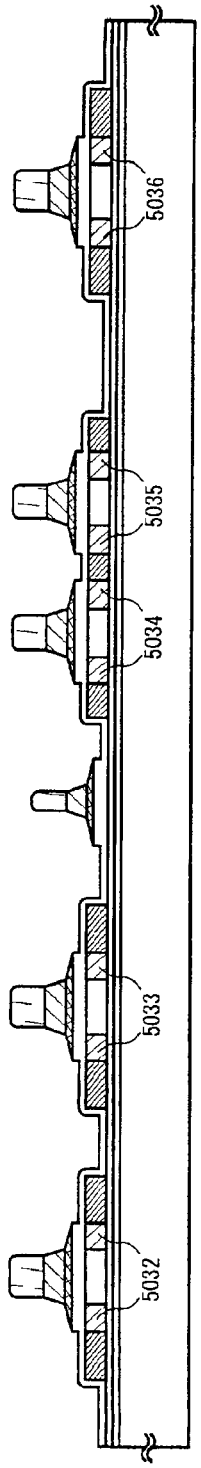
FIGS. 11A to 11C show a manufacture process of the EL display according to the present invention.

Then, as shown in FIG. 11A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1\times10^{13}$ atoms/cm$^2$, so that new impurity regions are formed inside of the first impurity regions formed into the island-like semiconductor layers in FIG. 10B. Doping is carried out such that the second shape conductive layers 5026 to 5030 are used as masks to the impurity element and the impurity element is added also to the regions under the first conductive layers 5026a to 5030a. In this way, third impurity regions 5032 to 5036 are formed. The concentration of phosphorous (P) added to the third impurity regions has a gentle concentration gradient in accordance with the thickness of tapered portions of the first conductive layers 5026a to 5030a. Note that in the semiconductor layer that overlap with the tapered portions of the first conductive layers 5026a to 5030a, the concentration of impurity element slightly falls from the end portions of the tapered portions of the first conductive layers 5026a to 5030a toward the inner portions, but the concentration keeps almost the same level.

Figure 11B:
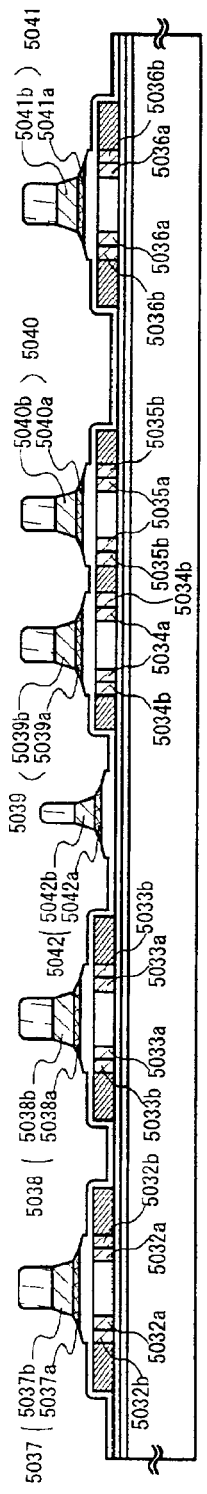

As shown in FIG. 11B, a third etching process is performed. This is performed by using a reactive ion etching method (RIE method) with an etching gas of $CHF_6$. The tapered portions of the first conductive layers 5026a to 5031a are partially etched, and the region in which the first conductive layers overlap with the semiconductor layer is reduced by the third etching process. Third shape conductive layers 5037 to 5042 (first conductive layers 5037a to 5042a and second conductive layers 5037b to 5042b) are formed. At this point, regions of the gate insulating film 5007, which are not covered with the third shape conductive layers 5037 to 5042 are made thinner by about 20 to 50 nm by etching.

By the third etching process, third impurity regions 5032a to 5036a, which overlap with the first conductive layers 5037a to 5042a, and second impurity regions 5032b to 5236b between the first impurity regions and the third impurity regions are formed.

Figure 11C:
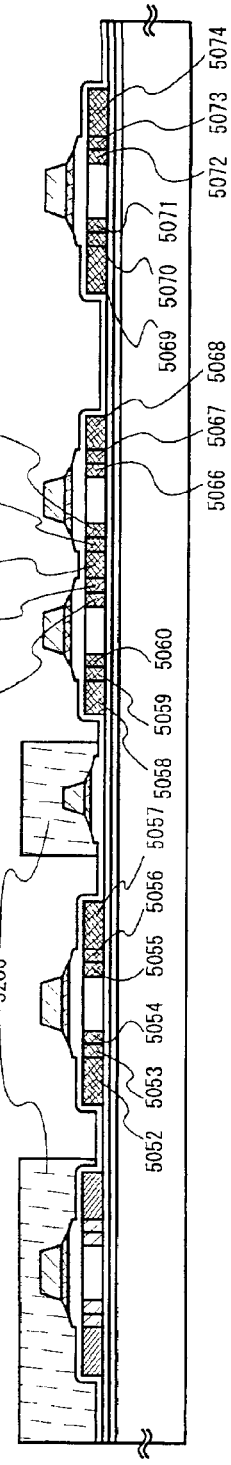

Then, as shown in FIG. 11C, fourth impurity regions 5052 to 5074 having a conductivity type opposite to the first conductivity type are formed in the island-like semiconductor layers 5004 to 5006 forming p-channel TFTs. The second conductive layers 5038b to 5041b are used as masks to an impurity element, and the impurity regions are formed in a self-aligning manner. At this time, the whole surfaces of the island-like semiconductor layers 5003 and the wiring portion 5031, which form n-channel TFTs are covered with a resist mask 5200. Phosphorus is added to the impurity regions 5052 to 5074 at different concentrations, respectively. The regions are formed by an ion doping method using diborane ($B_2H_6$) and the impurity concentration is made $2\times10^{20}$ to $2\times10^{21}$ atoms/cm$^3$ in any of the regions.

By the steps up to this, the impurity regions are formed in the respective island-like semiconductor layers. The third shape conductive layers 5037 to 5041 overlapping with the island-like semiconductor layers function as gate electrodes. The conductive layer 5042 functions as an island-like source signal line.

After the resist mask 5200 is removed, a step of activating the impurity elements added in the respective island-like semiconductor layers for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 6, a heat treatment is conducted at 500° C. for 4 hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for hydrogenation, plasma hydrogenation (using hydrogen excited by plasma) may be carried out.

Next, as shown in FIG. 12A, a first interlayer insulating film 5075 having a thickness of 100 to 200 nm is formed of a silicon nitride oxide film. A second interlayer insulating film 5076 made of an organic insulator material is formed thereon. Contact holes are then formed with respect to the first interlayer insulating film 5075, the second interlayer insulating film 5076, and the gate insulating film 5007, respective wirings (including connection wirings and signal lines) 5077 to 5082, and 5084 are formed by patterning, and then, a pixel electrode 5083 that contacts with the connection wiring 5082 is formed by patterning.

Next, the film made from organic resin is used for the second interlayer insulating film 5076. As the organic resin, polyimide, polyamide, acryl, BCB (benzocyclobutene) or the like can be used. Especially, since the second interlayer insulating film 5076 has rather the meaning of flattening, acryl excellent in flatness is desirable. In Embodiment 6, an acryl film is formed to such a thickness that stepped portions formed by the TFTs can be adequately flattened. The thickness is preferably made 1 to 5 $\mu$m (more preferably 2 to 4 $\mu$m).

In the formation of the contact holes, dry etching or wet etching is used, and contact holes reaching the n-type impurity regions 5017 and 5018 or the p-type impurity regions 5052 to 5074, a contact hole reaching the wiring 5031, a contact hole reaching the power source supply line (not shown), and contact holes reaching the gate electrodes (not shown) are formed, respectively.

Further, a lamination film of a three layer structure, in which a 100 nm thick Ti film, a 300 nm thick aluminum film containing Ti, and a 150 nm thick Ti film are formed in succession by sputtering, is patterned into a desirable shape, and the resultant lamination film is used as the wirings (including connection wirings and signal lines) 5077 to 5082, and 5084. Of course, other conductive films may be used.

Furthermore, in Embodiment 6, an ITO film is formed with a thickness of 110 nm, and patterning is performed to form the pixel electrode 5083. The pixel electrode 5083 is arranged so as to contact and overlap the connection wiring 5082 so that contact is obtained. Further, a transparent conductive film in which zinc oxide (ZnO) of 2 to 20% is mixed with indium oxide may be used. This pixel electrode 5083 corresponds to an anode of an EL element. (FIG. 12A)

Nest, as shown in FIG. 12B, an insulating film containing silicon (a silicon oxide film in Embodiment 6) is formed with a thickness of 500 nm, an opening portion is formed at the position corresponding to the pixel electrode 5083, and then, a third interlayer insulating film 5085 that functions as a bank is formed. In forming the opening portion, side walls having a tapered shape may be easily formed by using wet etching. The deterioration of the EL layer due to stepped portion becomes a remarkable problem if the side walls of the opening portion are sufficiently flat.

An EL layer 5086 and a cathode (MgAg electrode) 5087 are formed next in succession, without exposure to the atmosphere, using a vacuum evaporation method. Note that the film thickness of the EL layer 5086 may be set from 80 to 200 nm (typically between 100 and 120 nm), and the thickness of the cathode 5087 may be set from 180 to 300 nm (typically 200 to 250 nm).

The EL layer 5086 and the cathode 5087 are formed one after another with respect to pixels corresponding to the color red, pixels corresponding to the color green, and pixels corresponding to the color blue. However, the EL layer is weak with respect to a solution, and therefore the EL layer and the cathode must be formed with respect to each of the colors without using a photolithography technique. It is preferable to cover areas outside of the desired pixels using a metal mask, and selectively form the EL layer and the cathode only in the necessary locations.

In other words, a mask is first set so as to cover all pixels except for those corresponding to the color red, and the EL layer for emitting red color light is selectively formed using the mask. Next, a mask is set so as to cover all pixels except for those corresponding to the color green, and the EL layer for emitting green color light is selectively formed using the mask. Similarly, a mask is set so as to cover all pixels except for those corresponding to the color blue, and the EL layer for emitting blue color light is selectively formed using the mask. Note that the use of all different masks is stated here, but the same mask may also be reused.

The method of forming three kinds of EL elements corresponding to the colors RGB is used here, but a method of combining a white color light emitting EL element and a color filter, a method of combining a blue or blue-green color light emitting EL element and a fluorescing body (fluorescing color conversion layer: CCM), a method of using a transparent electrode as a cathode (opposing electrode) and overlapping it with EL elements each corresponding to one of the colors RGB and the like may be used.

A known material can be used as the EL layer 5086. Considering the driver voltage, it is preferable to use an organic material as the known material. For example, a four layer structure constituted of a hole injecting layer, a hole transporting layer, a light emitting layer and an electron injecting layer may be adopted as an EL layer.

Next, the cathode 5087 is formed using a metal mask on the pixels having the switching TFTs of which the gate electrodes are connected to the same gate signal line (pixels on the same line). Note that, in Embodiment 6, although MgAg is used as the cathode 5087, the present invention is not limited to this. Other known materials may be used for the cathode 5087.

Finally, a passivation film 5089 made of a silicon nitride film is formed with a thickness of 300 nm. The formation of the passivation film 5089 enables the EL layer 5086 to be protected against moisture and the like, and the reliability of the EL element can further be enhanced.

Consequently, the EL display with the structure as shown in FIG. 12A is completed. Note that, in the manufacturing process of the EL display in Embodiment 6, the source signal lines are formed from Ta and W, which are materials for forming gate electrodes, and the gate signal lines are formed from Al, which is a material for forming wirings, but different materials may be used.

Incidentally, the EL display in Embodiment 6 exhibits the very high reliability and has the improved operational characteristic by providing TFTs having the most suitable structure in not only the pixel portion but also the driver circuit portion. Further, it is also possible to add a metallic catalyst such as Ni in the crystallization process, thereby increasing crystallinity. It therefore becomes possible to set the driving frequency of the source signal line driver circuit to 10 MHz or higher.

First, a TFT having a structure in which hot carrier injection is reduced without decreasing the operating speed as much as possible is used as an n-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 6, the active layer of the n-channel TFT contains the source region, the drain region, the LDD region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the p-channel TFT of the CMOS circuit, and therefore LDD regions may not be formed in particular. It is of course possible to form LDD regions similar to those of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as an example of such. Further, when a CMOS circuit in which it is necessary to suppress the value of the off current as much as possible is used, the n-channel TFT forming the CMOS circuit preferably has an Lov region. A circuit such as the transmission gate used in dot-sequential drive can be given as an example of such.

Note that, in practice, it is preferable to perform packaging (sealing), without exposure to the atmosphere, using a protecting film (such as a laminated film or an ultraviolet cured resin film) having good airtight properties and little outgassing, or a transparent sealing material, after completing through the state of FIG. 12B. At this time, the reliability of the EL element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed. This state at which the product is ready for shipment is referred to as an EL display throughout this specification.

Furthermore, in accordance with the process shown in Embodiment 6, the number of photo masks required for manufacture of an EL display can be suppressed. As a result, the process can be shortened, and the reduction of the manufacturing cost and the improvement of the yield can be attained.

Note that it is possible to implement Embodiment 6 in combination with Embodiments 1 to 5.

[Embodiment 7]

Figure 13:
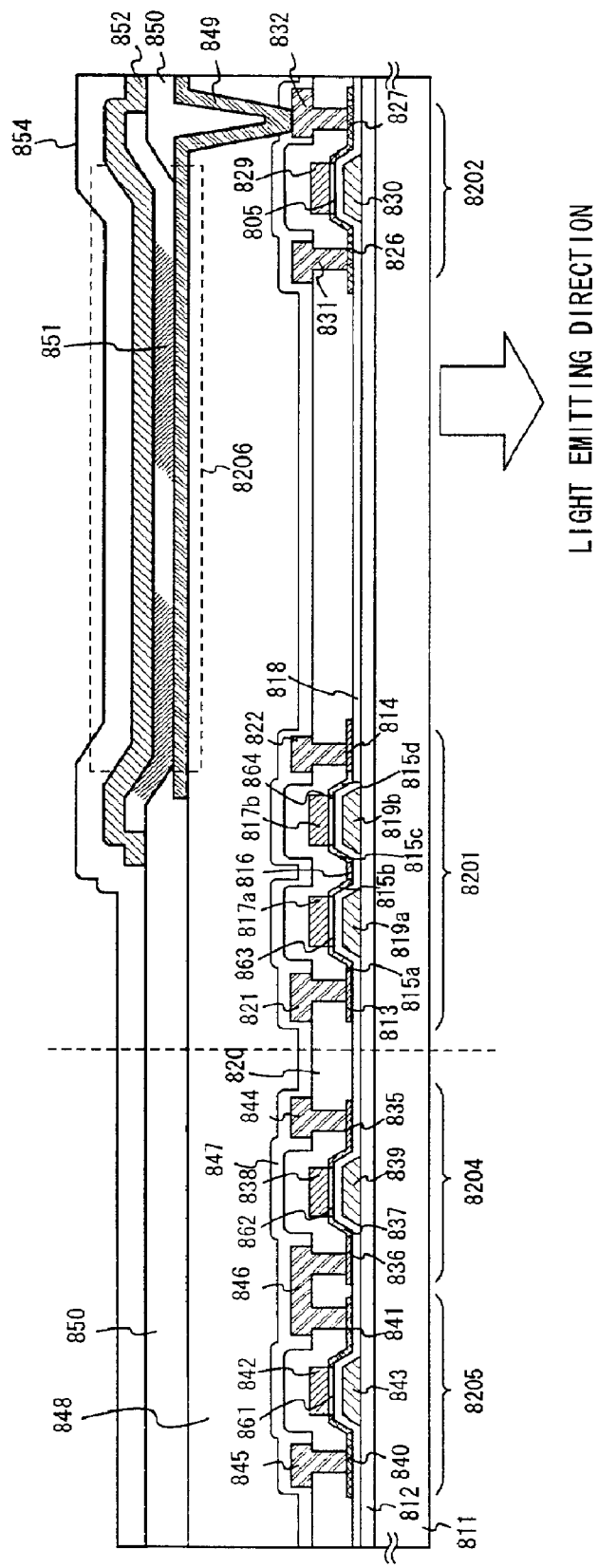
FIG. 13 is a view showing in detail a cross-section of the EL display according to the present invention.

An outline of a cross sectional structure of an EL display of the present invention is explained in Embodiment 7 using FIG. 13, an example differing from that of FIGS. 12A to 12C. An example is shown in FIGS. 12A to 12C in which the switching TFT and EL driver TFTs are top gate TFTs, but an example of using bottom gate thin film transistors for the TFTs is explained in Embodiment 7.

Reference numeral 811 denotes a substrate in FIG. 13, and reference numeral 812 denotes an insulating film which becomes a base (hereafter referred to as a base film). A light transmitting substrate, typically a glass substrate, a quartz substrate, a glass ceramic substrate, or a crystalline glass substrate can be used as the substrate 811. However, the substrate used must be one able to withstand the highest process temperature during the manufacturing processes.

Further, the base film 812 is particularly effective when using a substrate containing mobile ions or a substrate which has conductivity, but the base film 812 need not be formed on a quartz substrate. An insulating film containing silicon may be used as the base film 812. Note that the term insulating film containing silicon specifically indicates an insulating film such as a silicon oxide film, a silicon nitride film, and a silicon oxynitride film (denoted as SiOxNy, where x and y are arbitrary integers) containing oxygen or nitrogen at predetermined ratios with respect to silicon.

Reference numeral 8201 denotes a switching TFT, reference numeral 8202 denotes a EL driver TFT, and both are formed by n-channel TFT and p-channel TFTs respectively. When the direction of EL light emitted is toward the substrate lower side (surface where TFTs and the EL layer are not formed), the above structure is preferable. However, the present invention is not limited to this structure. The switching TFT and the EL driver TFT may be either n-channel TFTs or p-channel TFTs.

The switching TFT 8201 has an active layer containing a source region 813, a drain region 814, LDD regions 815a to 815d, a separation region 816, and channel forming regions 817a and 817b, a gate insulating film 818, gate electrodes 819a and 819b, a first interlayer insulating film 820, a source signal line 821 and a drain wiring 822. Note that the gate insulating film 818 and the first interlayer insulating film 820 may be common among all TFTs on the substrate, or may differ depending upon the circuit or the element.

Furthermore, the switching TFT 8201 shown in FIG. 13 is electrically connected to the gate electrodes 817a and 817b, becoming namely a double gate structure. Not only the double gate structure, but also a multi-gate structure (a structure containing an active layer having two or more channel forming regions connected in series) such as a triple gate structure, may of course also be used.

The multi-gate structure is extremely effective in reducing the off current, and provided that the off current of the switching TFT is sufficiently lowered, a capacitor connected to the gate electrode of the first EL driver TFT 8202 can be have its capacitance reduced to the minimum necessary. Namely, the surface area of the capacitor can be made smaller, and therefore using the multi-gate structure is also effective in expanding the effective light emitting surface area of the EL elements.

In addition, the LDD regions 815a to 815d are formed so as not to overlap the gate electrodes 819a and 819b through the gate insulating film 818 in the switching TFT 8201. This type of structure is extremely effective in reducing the off current. Furthermore, the length (width) of the LDD regions 815a to 815d may be set from 0.5 to 3.5 $\mu$m, typically between 2.0 and 2.5 $\mu$m.

Note that forming an offset region (a region which is a semiconductor layer having the same composition as the channel forming region and to which the gate voltage is not applied) between the channel forming region and the LDD region is additionally preferable in that the off current is lowered. Further, when using a multi-gate structure having two or more gate electrodes, the separation region 816 (a region to which the same impurity element, at the same concentration, as that added to the source region or the drain region, is added) is effective in reducing the off current.

Next, the first EL driver TFT 8202 is formed having an active layer containing a source region 826, a drain region 827, and a channel forming region 829; the gate insulating film 818; a gate electrode 830, the first interlayer insulating film 820; a source wiring 831; and a drain wiring 832. The first EL driver TFT 8202 is a p-channel TFT in Embodiment 7.

Further, the drain region 814 of the switching TFT 8201 is connected to the gate electrode 830 of the first EL driver TFT 8202. Although not shown in the figure, specifically the gate electrode 830 of the EL driver TFT 8202 is electrically connected to the drain region 814 of the switching TFT 8201 through the drain wiring (also referred to as a connection wiring) 822. The source signal line 831 of the first EL driver TFT 8202 is connected to an power source supply line (not shown in the figure).

The first EL driver TFT 8202 is an element for controlling the amount of electric current injected to the EL element

8206, and a relatively large amount of current flows. It is therefore preferable to design the channel width W to be larger than the channel width of the switching TFT 8201. Further, it is preferable to design the channel length L such that an excess of electric current does not flow in the EL driver TFT 8202. It is preferable to have from 0.5 to 2 $\mu$A (more preferably between 1 and 1.5 $\mu$A) per pixel.

In addition, by making the film thickness of the active layers (particularly the channel forming region) of the EL driver TFT 8202 thicker (preferably from 50 to 100 nm, even better between 60 and 80 nm), degradation of the TFT may be suppressed. Conversely, it is also effective to make the film thickness of the active layer (particularly the channel forming region) thinner (preferably from 20 to 50 nm, even better between 25 and 40 nm), from the standpoint of making the off current smaller, for the case of the switching TFT 8201.

The structures of the TFTs formed within the pixel are explained above, but a driver circuit is also formed simultaneously at this point. A CMOS circuit, which becomes a basic unit for forming the driver circuit, is shown in FIG. 13.

A TFT having a structure in which hot carrier injection is reduced without an excessive drop in the operating speed is used as an n-channel TFT 8204 of the CMOS circuit in FIG. 13. Note that the term driver circuit indicates a source signal line driver circuit, a gate signal line driver circuit and a counter power source driver circuit here. It is also possible to form other logic circuit (such as a level shifter, an A/D converter, and a signal division circuit).

An active layer of the n-channel TFT 8204 of the CMOS circuit contains a source region 835, a drain region 836, an LDD region 837, and a channel forming region 838. The LDD region 837 overlaps with a gate electrode 839 through the gate insulating film 818.

Formation of the LDD region 837 on only the drain region 836 side is so as not to have drop the operating speed. Further, it is not necessary to be very concerned about the off current with the n-channel TFT 8204, and it is good to place more importance on the operating speed. It is therefore preferable to eliminate the offset.

Furthermore, there is almost no need to be concerned with degradation of a p-channel TFT 8205 of the CMOS circuit, due to hot carrier injection, and therefore no LDD region need be formed in particular. Its active layer therefore contains a source region 840, a drain region 841, and a channel forming region 842, and a gate insulating film 818 and a gate electrode 843 are formed on the active layer. It is also possible, of course, to take measures against hot carrier injection by forming an LDD region similar to that of the n-channel TFT 8204.

Note that reference numerals 861 to 865 denote masks for forming channel forming regions 842, 838, 817*a*, 817*b* and 829.

Further, the n-channel TFT 8204 and the p-channel TFT 8205 have source signal lines 844 and 845, respectively, on their source regions, through the first interlayer insulating film 820. In addition, the drain regions of the n-channel TFT 8204 and the p-channel TFT 8205 are mutually connected electrically by a drain wiring 846.

Next, reference numeral 847 denotes a first passivation film, and its film thickness may be set from 10 nm to 1 $\mu$m (preferably between 200 and 500 nm). An insulating film containing silicon (in particular, it is preferable to use an oxidized silicon nitride film or a silicon nitride film) can be used as the passivation film material. The passivation film 847 possesses a role of protecting the TFTs from alkaline metals and moisture. Alkaline metals such as sodium are contained in an EL layer formed last on the final TFT (in particular, the EL driver TFT). In other words, the first passivation film 847 works as a protecting layer so that these alkaline metals (mobile ions) do not penetrate into the TFT.

Further, reference numeral 848 denotes a second interlayer insulating film, which has a function as a leveling film for performing leveling of a step due to the TFTs. An organic resin film is preferable as the second interlayer insulating film 848, and one such as polyimide, polyamide, acrylic, or BCB (benzocyclobutene) may be used. These organic resin films have the advantages of easily forming a good, level surface, having a low specific dielectric constant. The EL layer is extremely sensitive to unevenness, and therefore it is preferable to mostly absorb the TFT step by the second interlayer insulating film 848. In addition, it is preferable to form the low specific dielectric constant material thickly in order to reduce the parasitic capacitance formed between the gate signal wiring, the source signal wiring and the cathode of the EL element. The thickness, therefore, is preferably from 0.5 to 5 $\mu$m (more preferably between 1.5 and 2.5 $\mu$m).

Further, reference numeral 849 denotes a pixel electrode (EL element anode) made from a transparent conducting film. After forming a contact hole (opening) in the second interlayer insulating film 848 and in the first passivation film 847, the pixel electrode 849 is formed so as to be connected to the drain wiring 832 of the first EL driver TFT 8202. Note that if the pixel electrode 849 and the drain region 827 are formed so as not to be directly connected, as in FIG. 13, then alkaline metals of the EL layer can be prevented from entering the active layer via the pixel electrode.

A third interlayer insulating film 850 is formed on the pixel electrode 849 from a silicon oxide film, a silicon oxynitride film, or an organic resin film, with a thickness of from 0.3 to 1 $\mu$m. The third interlayer insulating film 850 functions as a bank. An open portion is formed in the third interlayer insulating film 850 over the pixel electrode 849 by etching, and the edge of the open portion is etched so as to become a tapered shape. The taper angle may be set from 10 to 60°, (preferably between 30 and 50°). In particular, light emitting irregularities of the EL layer 851 due to a step in the pixel electrode 849 which develops in a contact hole portion can be prevented by forming the third interlayer insulating film 850 on portions in which the pixel electrode 849 and the EL driver TFT 8202 and the drain wiring 832 are connected.

An EL layer 851 is formed on the third interlayer insulating film 850. A single layer structure or a lamination structure can be used for the EL layer 851, but the lamination structure has a better light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of such as a fluorescing pigment into the EL layer may also be performed.

The structure of FIG. 13 is an example of a case of forming three types of EL elements corresponding to R, G, and B. Note that although only one pixel is shown in FIG. 13, pixels having an identical structure are formed corresponding to red, green and blue colors, respectively, and that color display can thus be performed. It is possible to implement the present invention without concern as to the method of color display.

A cathode 852 of the EL element is formed on the EL layer 851 as a counter electrode. A material containing a low work coefficient material such as magnesium (Mg), lithium (Li), or calcium (Ca), is used as the cathode 852. Preferably, an electrode made from MgAg (a material made from Mg and Ag at a mixture of Mg:Ag=10:1) is used. In addition, a MgAgAl electrode, an LiAl electrode, and an LiFAl electrode can be given as other examples.

It is preferable to form the cathode 852 in succession, without exposure to the atmosphere, after forming the EL layer 851. This is because the interface state between the cathode 852 and the EL layer 851 greatly influences the light emitting efficiency of the EL element. Note that, throughout this specification, an EL element formed by a pixel electrode (anode), an EL layer, and a cathode is referred to as an EL element 8206.

The lamination body composed of the EL layer 851 and the cathode 852 must be formed separately for each pixel, but the EL layer 851 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing, screen printing or spin coating as the method of selectively forming the EL layer. However, the cathode cannot be formed in succession with these methods at present, and therefore it is preferable to use the other methods stated above.

Reference numeral 854 denotes a second passivation film, which may be formed with a film thickness of 10 nm to 1 $\mu$m (preferably between 200 and 500 nm). The aim of forming the second passivation film 854 is mainly for protecting the EL layer 851 from moisture, but it is also effective to give the second passivation film 854 a heat radiating effect. Note that the EL layer is weak with respect to heat, as stated above, and therefore it is preferable to perform film formation at as low a temperature as possible (preferably within a temperature range from room temperature to 120° C.). Plasma CVD, sputtering, vacuum evaporation, ion plating, and solution coating (spin coating) can therefore be considered as preferable film formation methods.

Note that it goes without saying that all of the TFTs shown in FIG. 13 may have a polysilicon film as their active layer in the present invention.

The present invention is not limited to the structure of the EL display of FIG. 13, and the structure of FIG. 13 is merely one preferred embodiment for the implementation of the present invention.

Note that it is possible to implement Embodiment 7 in combination with Embodiments 1 to 5.

[Embodiment 8]

A process of manufacturing an EL display of the present invention in which a substrate on which an EL element is formed is sealed so that the EL element is not exposed to the atmosphere is explained in Embodiment 8. Note that FIG. 14A is a top surface diagram of an EL display of the present invention, and FIG. 14B is a cross sectional diagram.

Figure 14A:
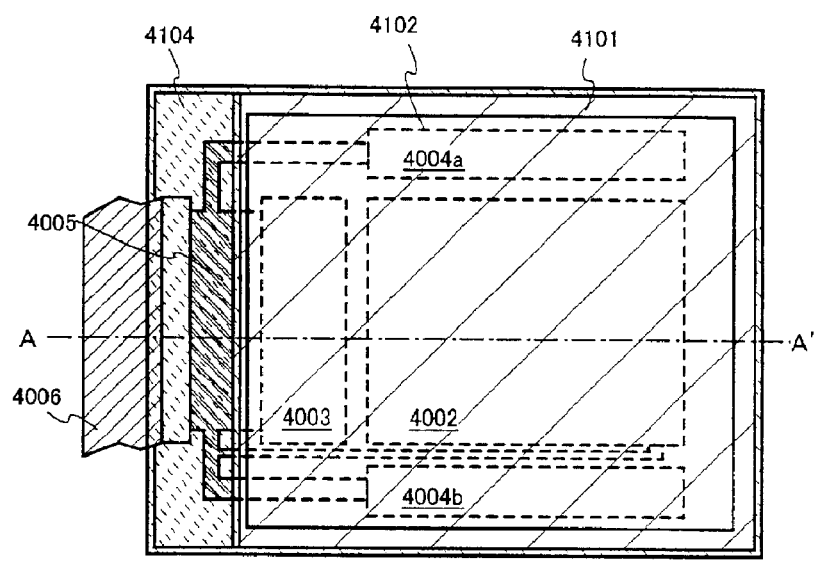
FIGS. 14A and 14B show a top view and a cross-sectional view of the EL display according to the present invention.
Figure 14B:
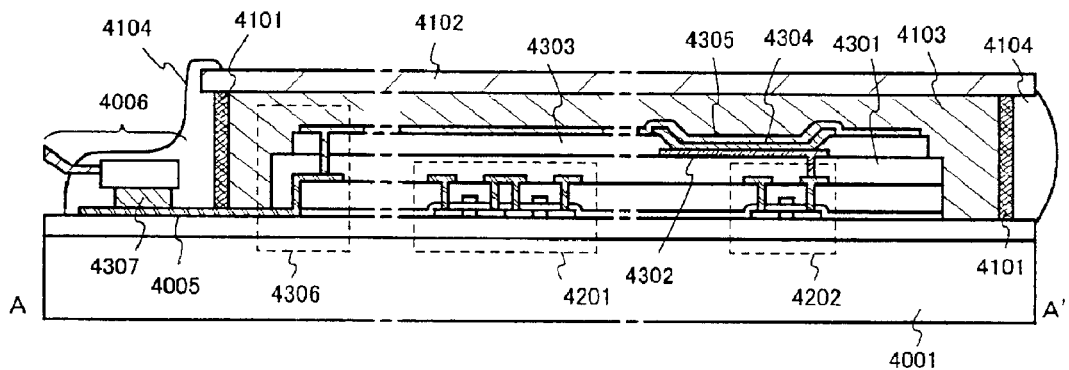

In FIGS. 14A and 14B, reference numeral 4001 denotes a substrate, reference numeral 4002 denotes a pixel portion, reference numeral 4003 denotes a source signal line driver circuit, 4004a denotes a gate signal line driver circuit, and 4004b denotes a counter power source line driver circuit. Each of the driver circuits is connected to external equipment via a wiring 4005 leading to an FPC (flexible printed circuit) 4006.

A first sealing material 4101, a cover material 4102, a filler material 4103, and a second sealing material 4104 are formed at this point so as to surround the pixel portion 4002, the source signal line driver circuit 4003, the gate signal line driver circuit 4004a, and the counter power source line driver circuit 4004b.

FIG. 14B is a cross sectional diagram corresponding to FIG. 14A cut along the line A–A'. A driver TFT 4201 (note that an n-channel TFT and a p-channel TFT are shown here) contained in the source signal line driver circuit 4003 on the substrate 4001, and an EL driver TFT 4202 (a TFT for controlling the electric current flowing in an EL element) contained in the pixel portion 4002 are formed.

A p-channel TFT or an n-channel TFT manufactured by a known method is used in the driver TFT 4201 in Embodiment 8, and a p-channel TFT manufactured by a known method is used in the EL driver TFT 4202. Further, a capacitor connected to a gate electrode (not shown in the figure) of the EL driver TFT 4202 is formed in the pixel portion 4002.

An interlayer insulating film (leveling film) 4301 is formed on the driver TFT 4201 and the EL driver TFT 4202 from a resin material, and a pixel electrode (anode) 4302 which is electrically connected to a drain region of the EL driver TFT 4202 is formed on the interlayer insulating film. A transparent conducting film having a large work coefficient is used as the pixel electrode 4302. A chemical compound of indium oxide and tin oxide, a chemical compound of indium oxide and zinc oxide, zinc oxide, tin oxide, and indium oxide can be used as the transparent conducting film. Further, gallium may also be doped into the above transparent conducting films.

An insulating film 4303 is then formed on the pixel electrode 4302, and an open portion is formed in the insulating film 4303 over the pixel electrode 4302. An EL layer 4304 is formed on the pixel electrode 4302 in the open portion. Known organic EL materials and known inorganic materials can be used for the EL layer 4304. Further, low molecular weight (monomer) materials and high molecular weight (polymer) materials exist as organic EL materials, and both may be used.

A known evaporation technique or a known application technique may be used as a method of forming the EL layer 4304. Further, the structure of the EL layer may be a lamination structure, or a single layer structure, in which hole injecting layers, hole transporting layers, light emitting layers, electron transporting layers, and electron injecting layers are freely combined.

A cathode 4305 composed of a conducting film having light shielding properties (typically a conducting film having aluminum, copper, or silver as its main constituent, or a lamination film of these and another conducting film) is formed on the EL layer 4304. The cathode 4305 is a part of the counter power source line, and it is formed simultaneously with the counter power source line. Furthermore, it is preferable to remove, as much as possible, moisture and oxygen existing in the interface between the cathode 4305 and the EL element 4304. It is therefore necessary to employ a scheme such as forming both films in succession within a vacuum, or one in which the EL layer 4304 is formed in a nitrogen or inert gas environment, and then the cathode 4305 is formed without exposure to oxygen or moisture. It is possible to perform the above stated film formation in Embodiment 8 by using a multi-chamber method (cluster tool method) film formation apparatus.

The cathode 4305 is then electrically connected to the wiring 4005 in a region shown by reference numeral 4306. The wiring 4005 is a wiring for imparting a predetermined voltage to the cathode 4305, and the wiring 4005 is electrically connected to the FPC 4006 through an anisotropic conductive film 4307.

An EL element composed of the pixel electrode (anode) 4302, the EL layer 4304, and the cathode 4305 is thus formed. The EL element is surrounded by the first sealing material 4101, and by the cover material 4102 which is joined to the substrate 4001 by the first sealing material 4101, and is enclosed by the filler material 4103.

Further, a glass material, a metallic material (typically a stainless steel material), a ceramic material, and a plastic material (including plastic films) can be used as the cover material 4102. An FRP (fiberglass reinforced plastics) plate, a PVF (polyvinyl fluoride) film, a mylar film, a polyester film, and an acrylic resin film can be used as the plastic material. Further, a sheet having a structure in which aluminum foil is sandwiched by a PVF film or a mylar film can also be used.

Note that, it is necessary for the cover material to be transparent for cases in which the irradiating direction of light from the EL elements is toward the cover material side. A transparent material such as a glass plate, a plastic plate, a polyester film, or an acrylic film, is used in this case.

Further, an ultraviolet hardening resin or a thermally hardening resin can be used as the filler material 4103. PVC (polyvinyl chloride), acrylic, polyimide, epoxy resin, silicon resin, PVB (polyvinyl butyral) and EVA (ethylene vinyl acetate) can be used. Deterioration of the EL elements can be suppressed if a drying agent (preferably barium oxide) or an oxidation preventing agent having an oxygen capturing effect is formed on the inside of the filler material 4103.

Furthermore, spacers may also be included within the filler material 4103. It is possible to give the spacers themselves moisture absorbency by forming the spacers from barium oxide. Further, when forming spacers, it is also effective to form a resin film on the cathode 4305 as a buffer layer for relieving pressure from the spacers.

The wiring 4005 is electrically connected to the FPC 4006 through the anisotropic conductive film 4307. The wiring 4005 transmits signals sent from the pixel portion 4002, the source signal line driver circuit 4003, the gate signal line driver circuit 4004a, and the counter power source line driver circuit 4004b to the FPC 4006, and the wiring is electrically connected to external equipment by the FPC 4006.

Further, the second sealing material 4104 is formed so as to cover exposed portions of the first sealing material 4101 and a portion of the FPC 4006, resulting in a structure in which the EL elements are completely cutoff from the atmosphere. This becomes the EL display having the cross sectional structure of FIG. 14B.

Note that it is possible to implement Embodiment 8 in combination with Embodiments 1 to 7.

[Embodiment 9]

Figure 15:
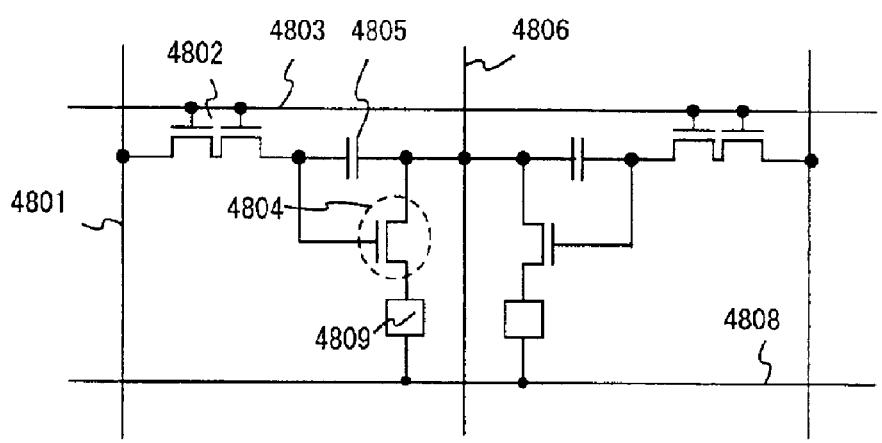
FIG. 15 is a circuit diagram of the pixel of the EL display according to the present invention.

A circuit diagram of a pixel having a structure which differs from that of FIG. 3 is explained in Embodiment 9 using FIG. 15. Note that, in Embodiment 9, reference numeral 4801 denotes a source signal line, reference numeral 4802 denotes a switching TFT, reference numeral 4803 denotes a gate signal line, 4804 denotes an EL driver TFT, 4805 denotes a capacitor, 4806 denotes a power source supply line, 4808 denotes a counter power source line, and reference numeral 4809 denotes an EL element.

FIG. 15 is a circuit as an example of a case in which the power source supply line 4806 is shared between two pixels. Namely, there is a characteristic in that two pixels are formed so as to have linear symmetry with the power source supply line 4806 as the center. The power source supply line 4806 is connected to the respective source region of EL driver TFT 4804 in two pixels.

In this case the number of power source supply lines can be reduced, and therefore the pixel portion can be made with additionally higher definition.

Note that it is possible to implement the constitution of Embodiment 9 in combination with the constitutions of Emobodiment 1 to 8.

[Emobodiment 10]

In Embodiment 10, a detailed structure of the source signal line driver circuit 102 shown in FIG. 9 will be described.

Figure 16:
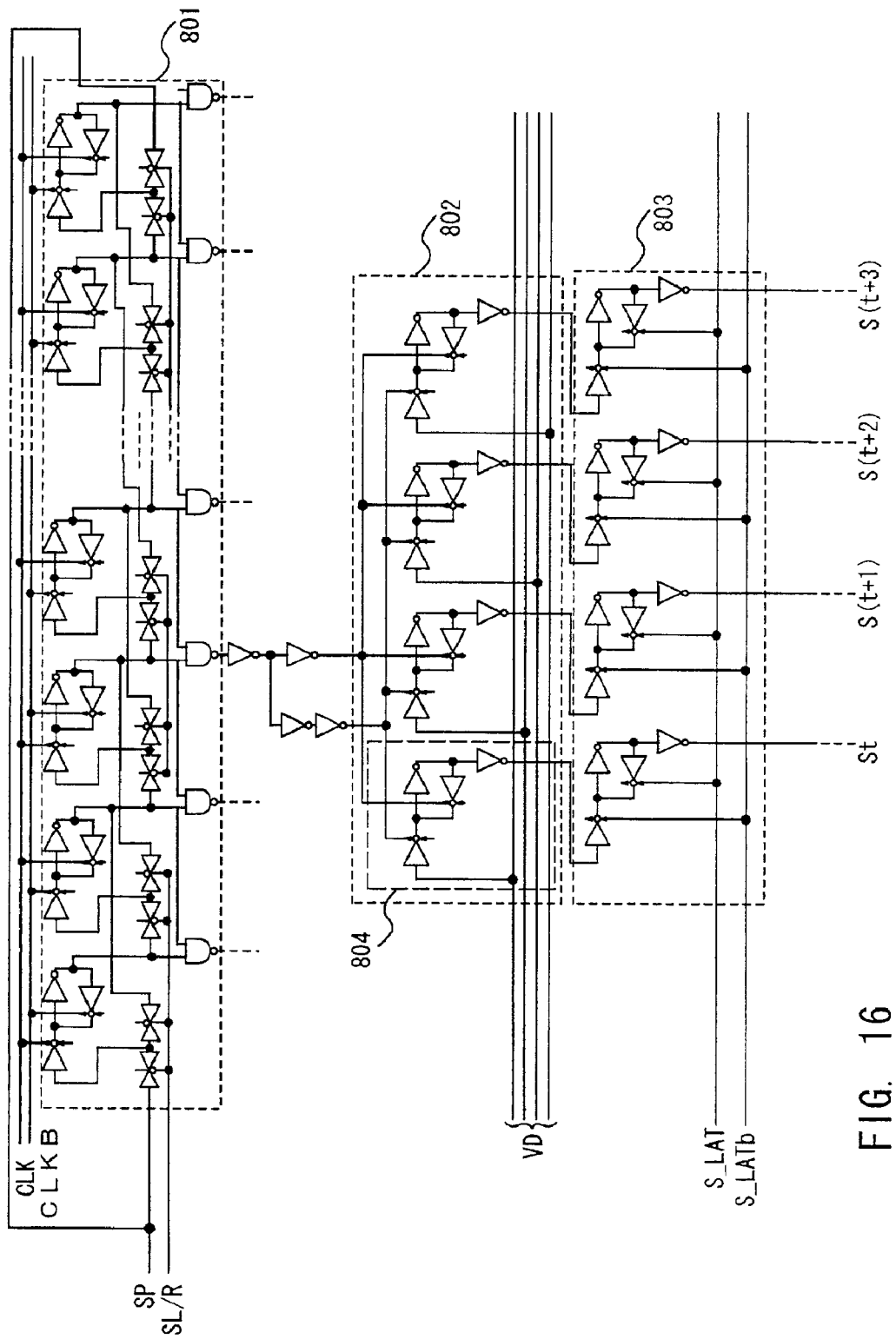
FIG. 16 is a circuit diagram of a source signal line driver circuit of the EL display according to the present invention.

A shift register 801, a latch(A) 802 and latch(B) 803 are placed as shown in FIG. 16. In Embodiment 10, a series of latch(A) 802 and a series of latch(B) 803 correspond to four source signal lines St through S(t+3). Although not provided in this embodiment, the designers may appropriately provide a level shift for varying a width of amplification of a voltage of a signal.

A clock signal CLK, a clock signal CLKB having an inverted polarity of the clock signal CLK, a start pulse signal SP, and a driving direction switching signal SL/R are respectively input to the shift register 801 through wirings shown in the figure. A digital video signal VD is externally input to the latch(A) 802 through a wiring shown in the figure. A latch signal S_LAT and a signal S_LATb having an inverted polarity of the latch signal S_LAT are respectively input to the latch(B) 803 through wirings shown in the figure.

For a detailed structure of the latch(A) 802, a part 804 of the latch(A) 802 corresponding to the source signal line St is described by way of example. The part 804 of the latch(A) 802 includes two clocked inverters and two inverters.

Figure 17:
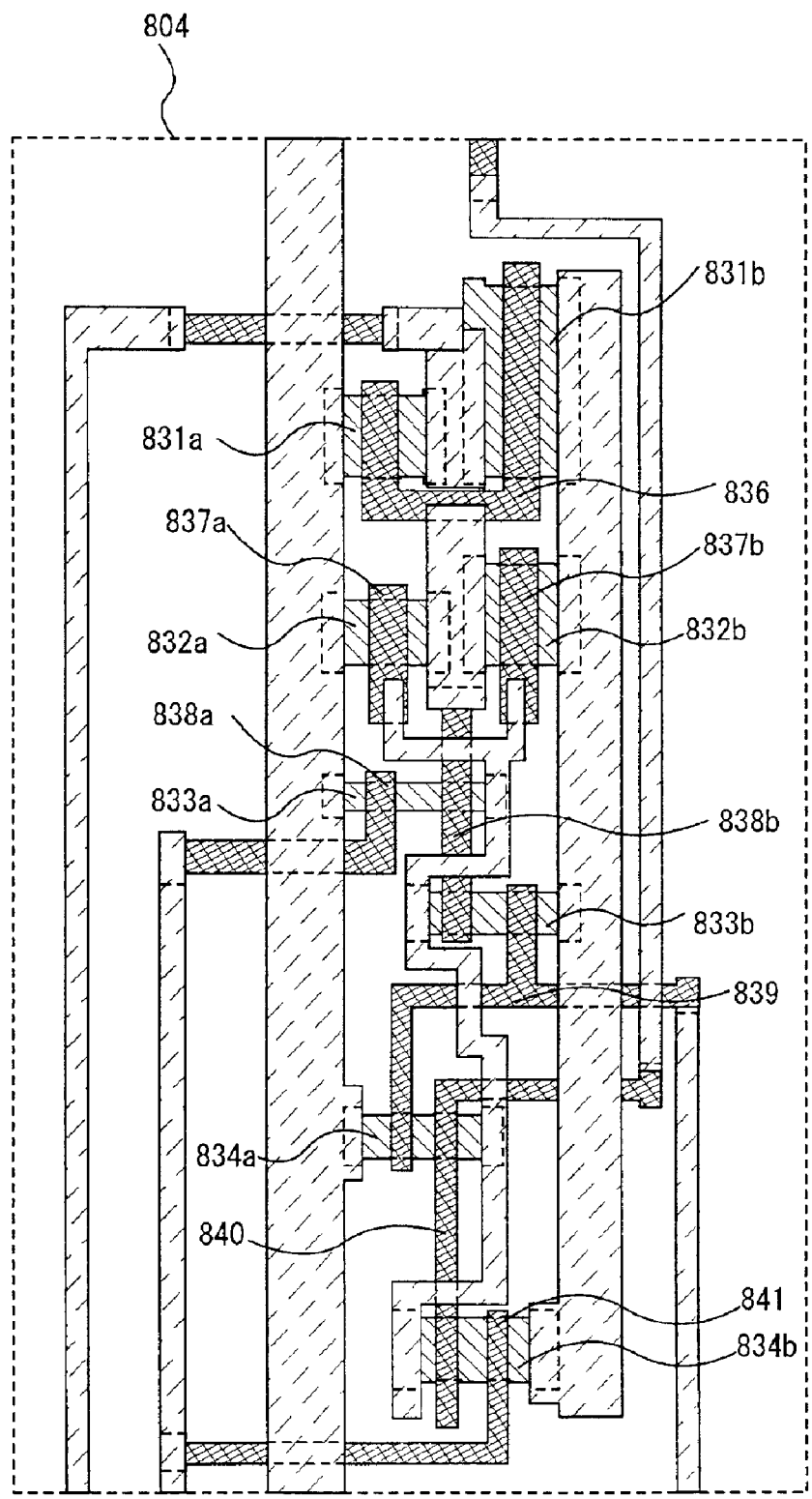
FIG. 17 is top view of a latch of a source signal line driver circuit of the EL display according to the present invention.

FIG. 17 shows a top view of the part 804 of the latch(A) 802. TFTs forming one of the inverters included in the part 804 of the latch(A) 802 have active layers and a gate electrode 836 common to the TFTs forming the inverter. TFTs forming the other inverter included in the part 804 of the latch(A) 802 have active layers 832a and 832b, respectively. Gate electrodes 837a and 837b are respectively provided on the active layers 832a and 832b. Further, the gate electrodes 837a and 837b are electrically connected with each other.

TFTs forming one of the clocked inverters included in the part 804 of the latch(A) 802 have active layers 833a and 833b. Gate electrodes 838a and 838b are provided on the active layer 833a to provide a double-gate structure. In the same manner, gate electrodes 838b and 839 are provided on the active layer 833b to provide a double-gate structure.

TFTs forming the other clocked inverter included in the part 804 of the latch(A) 802 have active layers 834a and 834b. Gate electrodes 839 and 840 are provided on the active layer 834a to provide a double-gate structure. In the same manner, gate electrodes 840 and 841 are provided on the active layer 834b to provide a double-gate structure.

[Embodiment 11]

Materials used as an EL layer of an EL element in an EL display according to the present invention are not limited to organic EL materials. The present invention can also be implemented using inorganic EL materials. However, the driving voltage of inorganic EL materials is extremely high at present, and therefore a TFT which is able to withstand the high driving voltage must be used.

Further, provided that organic EL materials with lower driving voltage are developed in the future, it will be possible to apply these materials to the present invention.

Furthermore, it is possible to implement the constitution of Embodiment 11 in combination with Embodiments 1 to 10.

[Embodiment 12]

Organic materials used as EL layers in the present invention may be low molecular weight organic materials, or may be polymer (high molecular weight) organic materials. Materials such as Alq$_3$ (tris-8-aluminum quinolinolate complex) and TPD (triphenylamine derivative) are known as examples of low molecular weight organic materials, and π conjugate polymer materials can be given as polymer organic materials. Typically, materials such as PPV (polyphenylene vinylene), PVK (polyvinyl carbazole), and polycarbonate can be given as examples of such.

Polymer (high molecular weight) organic materials can be formed into a film by an easy thin film formation method such as spin coating (also referred to as solution application), dipping, dispensing, printing, or ink jet printing, and have high heat resistance compared to low molecular weight organic materials.

Further, when the EL layers of EL elements of the EL display according to the present invention have an electron transporting layer and a hole transporting layer, the electron transporting layer and the hole transporting layer may also be formed of an inorganic material, for example, an amorphous semiconductor such as amorphous Si or amorphous $Si_{1-x}C_x$, for example.

A large amount of trap levels exist in amorphous semiconductors, and a large amount of interface levels are formed in an interface between the amorphous semiconductor and another layer. Therefore the EL element can emit light at a low voltage, and can be made higher in brightness.

Furthermore, a dopant (impurity) may be added to organic EL layers, and the color of the light emitted from the organic EL layers may also be changed. The following can be given as dopants: DCM1, nile red, librene, coumarin 6, TPB, and quinacridon.

Note that it is possible to implement Embodiment 12 in combination with Embodiments 1 to 11.

[Embodiment 13]

In Embodiment 13, in the case where a method of driving an EL display according to the present invention is used, what type of voltage-current characteristic is required to a region where it is preferable to drive EL driver TFTs will be described using FIGS. 18A and 18B, FIG. 19, and FIG. 20.

With even a slight change in voltage to be applied to the EL element, a current flowing through the EL element exponentially changes in a great manner. From another point of view, even if the amount of a current flowing through the EL element changes, a voltage value to be applied to the EL element does not greatly change. The brightness of the EL element proportionally increases with the amount of a current flowing through the EL element. Therefore, it is easy to control the brightness of the EL element by controlling the amount of a current (current value) flowing through the EL element rather than by controlling a voltage (voltage value) to be applied to the EL element because the control is hardly affected by TFT characteristics.

Figure 18A:
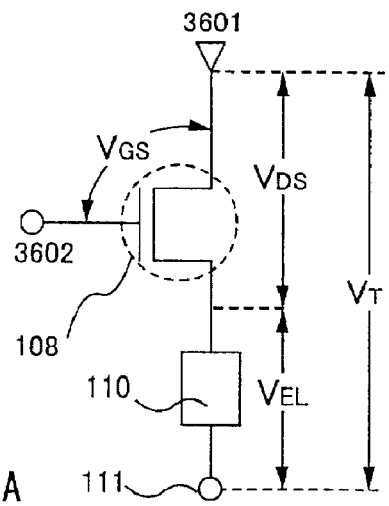
FIGS. 18A and 18B are a diagram showing a structure of a connection between an EL element and an EL driver TFT, and a graph showing voltage-current characteristics of an EL element and an EL driver TFT, respectively.
Figure 18B:
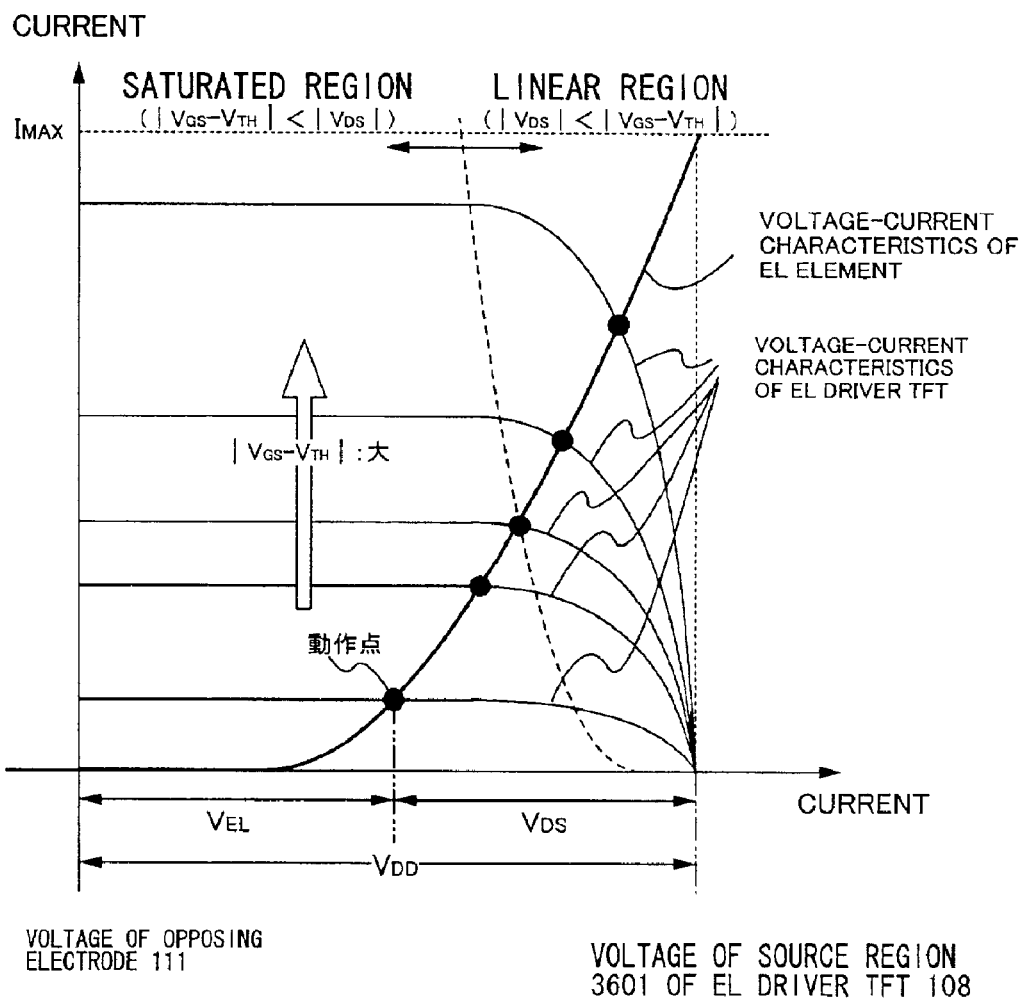

Refer to FIGS. 18A and 18B. FIG. 18A shows only the structure portion of the EL driver TFT 108, and the EL element 110, in the pixel of the EL display of the present invention shown in FIG. 3.

FIG. 18B shows voltage-current characteristics of the EL driver TFT 108 and the EL element 110 shown in FIG. 18A. A graph of the voltage-current characteristics of the EL driver TFT 108 shown in FIG. 18B shows the amount of a current flowing through a drain region of the EL driver TFT 108 with respect to a voltage $V_{DS}$ between the source region and the drain region. FIG. 18B shows a plurality of graphs at different voltages $V_{GS}$ between the source region and the gate electrode of the EL driver TFT 108.

As shown in FIG. 18A, a voltage applied between the pixel electrode and the opposing electrode 111 of the EL element 110 is denoted by $V_{EL}$, and a voltage applied between a terminal 3601 connected to the power source supply line and the opposing electrode 111 of the EL element 110 is denoted by $V_T$. A value of $V_T$ is fixed by the electric potential of the power source supply line. A voltage between the source region and the drain region of the EL driver TFT 108 is denoted by $V_{DS}$, and a voltage between a wiring 3602 connected to a gate electrode of the EL driver TFT 108, that is, a voltage between the gate electrode and the source region of the EL driver TFT 108 is denoted by $V_{GS}$.

The EL driver TFT 108 may be formed by either an n-channel TFT or a p-channel TFT.

The EL driver TFT 108 and the EL element 110 are connected in series with each other. Thus, a current value flowing through both elements (the EL driver TFT 108 and the EL element 110) is the same. Therefore, the EL driver TFT 108 and the EL element 110 shown in FIG. 18A are driven at a point of intersection (operating point) of the graphs showing voltage-current characteristics of both elements. In FIG. 18B, a voltage $V_{EL}$ is a voltage between the electric potential of the opposing electrode 111 and the electric potential at the operating point. A voltage $V_{DS}$ is a voltage between the electric potential at the terminal 3601 of the EL driver TFT 108 and the electric potential at the operating point. Accordingly; the voltage $V_T$ is equal to the sum of $V_{EL}$ and $V_{DS}$.

Then, the case where the voltage $V_{GS}$ is varied is considered. As is seen from FIG. 18B, with increase in value of $|V_{GS}-V_{TH}|$ of the EL driver TFT 108, in other words, with increase in value of $|V_{GS}|$, a current value flowing through the EL driver TFT 108 increases. The voltage $V_{TH}$ is a threshold voltage of the EL driver TFT 108. Therefore, as can be seen from FIG. 18B, a current value flowing through the EL element 110 at the operating point naturally increases. The brightness of the EL element 110 increases in proportion to a current value flowing through the EL element 110.

When a value of $|V_{GS}|$ increases to increase a current value flowing through the EL element 110, a value of $V_{EL}$ also increases in accordance with the current value. Since a value of $V_T$ is determined by the electric potential of the power source supply line, a value of $V_{DS}$ is correspondingly reduced with the increase in $V_{EL}$.

Moreover, as shown in FIG. 18B, the voltage-current characteristics of the EL driver TFT are divided into two regions, based on values of $V_{GS}$ and $V_{DS}$. A region where the relationship: $|V_{GS}-V_{TH}|<|V_{DS}|$ is satisfied is a saturated region, while a region where the relationship: $|V_{GS}-V_{TH}|>|V_{DS}|$ is satisfied is a linear region.

In the saturated region, the following Expression 1 is established. In Expression 1, $I_{DS}$ is a current value flowing through a channel formation region of the EL driver TFT 108. Moreover, $\beta=\mu C_o W/L$ is established, where $\mu$ is a mobility of the EL driver TFT 108, $C_o$ is a gate capacitance per unit region, and W/L is a ratio of a channel width W to a channel length L of a channel formation region.

$$I_{DS}=\beta(V_{GS}-V_{TH})^2/2 \qquad \text{(Expression 1)}$$

In the linear region, the following Expression 2 is established.

$$I_{DS}=\beta\{(V_{GS}-V_{TH})V_{DS}-V_{DS}^2/2\} \qquad \text{(Expression 2)}$$

As is understood from Expression 1, a current value hardly varies by $V_{DS}$ in the saturated region, and is determined uniquely by $V_{GS}$.

On the other hand, as is understood from Expression 2, a current value is determined by $V_{DS}$ and $V_{GS}$ in the linear region. With increase in $|V_{GS}|$, the EL driver TFT 108 operates within the linear region. Correspondingly, $V_{EL}$ gradually increases. Therefore, $V_{DS}$ is reduced by the amount of increase in $V_{EL}$. If $V_{DS}$ is reduced in the linear region, the amount of a current is also reduced. When $|V_{GS}|=\infty$ is established, a current value=$I_{MAX}$. Therefore, even with the greatest value of $|V_{GS}|$, a current larger than $I_{MAX}$ does not flow. Herein, $I_{MAX}$ is a current value flowing through the EL element 110 when $V_{EL}=V_T$ is established.

By controlling $|V_{GS}|$, it is possible to include the operating point in the saturated region or in the linear region.

Although it is desirable that the characteristics of all TFTs for current control are ideally the same, the threshold value $V_{TH}$ and the mobility $\mu$ actually differ for each EL driver TFT in many cases. If the threshold value $V_{TH}$ and the mobility $\mu$ differ in each EL driver TFT, a current value flowing through the channel formation region of the EL driver TFT 108 differs for each TFT even with the same value of $V_{GS}$ as can be understood from Expressions 1 and 2.

Figure 19:
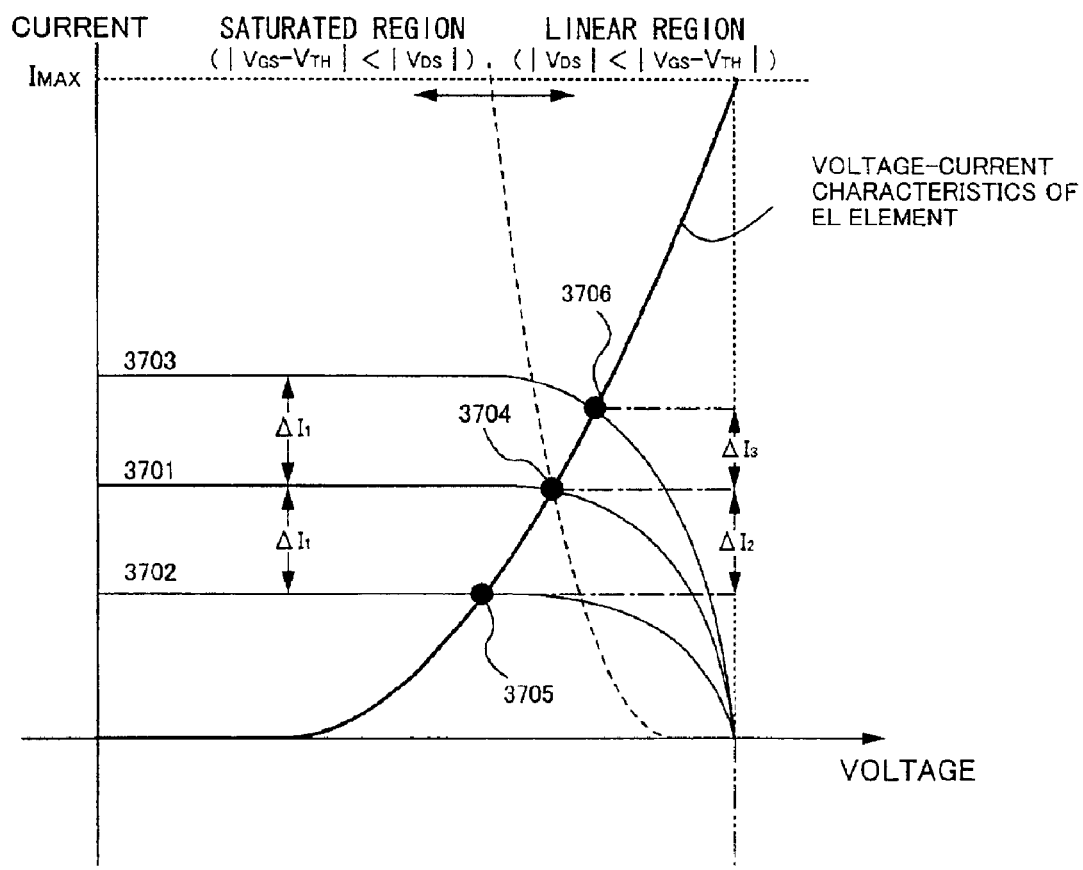
FIG. 19 is a graph showing voltage-current characteristics of the EL element and the EL driver TFT.

FIG. 19 shows current-voltage characteristics of an EL driver TFT with the threshold value $V_{TH}$ and the mobility $\mu$ being shifted. A solid line 3701 is a graph showing the ideal current-voltage characteristic. Solid lines 3702 and 3703 respectively show current-voltage characteristics of an EL driver TFT in the case where the threshold value $V_{TH}$ and the mobility $\mu$ are shifted from the ideal values. It is assumed that the graphs 3702 and 3703 of the current-voltage characteristics are shifted from the graph 3701 showing the current-voltage characteristic having the ideal characteristic by the same current value $\Delta I_1$ in the saturated region so that an operating point 3705 of the graph 3702 showing the current-voltage characteristic is present in the saturated region and an operating point 3706 of the graph 3703 of the current-voltage characteristics is present in the linear region. In this case, if the amounts of shift in current value at the operating point 3704 of graph 3701 of the current-voltage characteristic having an ideal characteristic and the current value at the operating points 3705 and 3706 are respectively represented by $\Delta I_2$ and $\Delta I_3$, the amount of shift in current value is smaller at the operating point 3706 in the linear region than at the operating point 3705 in the saturated region.

Thus, in the case where the digital driving method described in the present invention is employed, the EL driver TFT and the EL element are driven so that the operating point is present within the linear region. As a result, grayscale display can be performed with unevenness in brightness of the EL element due to shift in characteristics of the EL driver TFT being restrained.

In the case of the conventional analog driving, it is preferred to drive the EL driver TFT and the EL element so that the operating point is present within the saturated region where a current value can be controlled only by $|V_{GS}|$.

Figure 20:
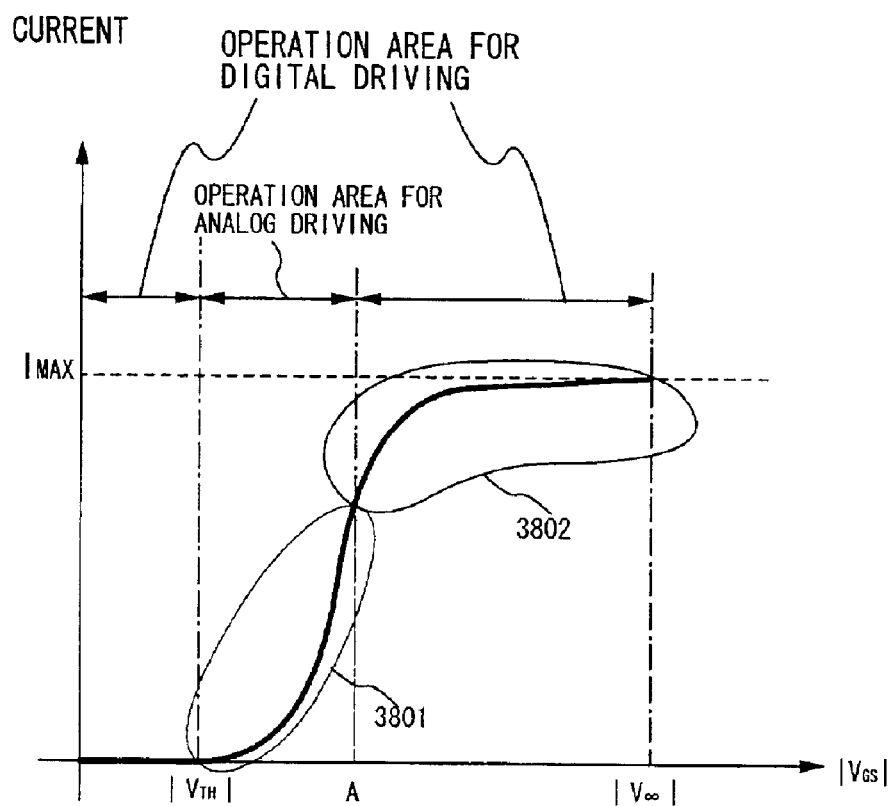
FIG. 20 is a graph showing the relationship between a gate voltage and a drain current of the EL driver TFT.

To summarize the above analysis of operation, FIG. 20 shows a graph of a current value with respect to a gate voltage $|V_{GS}|$ of the EL driver TFT. When a value of $|V_{GS}|$ is increased to be greater than an absolute value $|V_{TH}|$ of a threshold voltage of the EL driver TFT, the EL driver TFT is brought into a conductive state to allow a current to flow therethrough. In this specification, $|V_{GS}|$ at this point is referred to as a lighting starting point. Then, when $|V_{GS}|$ is further increased, $|V_{GS}|$ reaches such a value (this value is assumed as A) that satisfies $|V_{GS}-V_{TH}|=|V_{DS}|$. As a result, $|V_{GS}|$ shifts from the saturated region 3801 toward the linear region 3802. With a further increase in $|V_{GS}|$, a current value is increased to be finally saturated. At this point, $|V_{GS}|=\infty$ is established.

As can be seen from FIG. 20, through the region represented by: $|V_{GS}| \leq |V_{TH}|$, a current scarcely flows. A region represented by: $|V_{TH}| \leq |V_{GS}| \leq A$ is a saturated region where a current value is varied by $|V_{GS}|$. A region represented by: $A \leq |V_{GS}|$ is a linear region where a current value flowing through the EL element is varied by $|V_{GS}|$ and $|V_{DS}|$.

With the digital driving according to the present invention, it is preferred to use a region represented by: $|V_{GS}| \leq |V_{TH}|$ and the linear region represented by: $A \leq |V_{GS}|$.

Note that Embodiment 13 can freely be combined with Embodiments 1 to 12.

[Embodiment 14]

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electric apparatuses (light emitting apparatus). For example, in order to view a TV program or the like on a large-sized screen, the EL display device in accordance with the present invention can be used as a display portion of an EL display having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric apparatuses.

Such electric apparatuses include a video camera, a digital camera, a goggles-type display (head mount display), a car navigation system, a sound reproduction device (a car audio equipment, an audio equipment, or the like), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 21A through 22B respectively show various specific examples of such electronic devices.

Figure 21A:
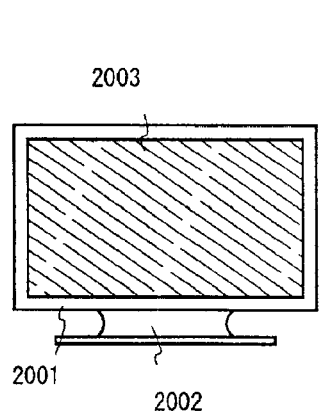
FIGS. 21A to 21F show specific examples of electronic equipment.

FIG. 21A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 21B:
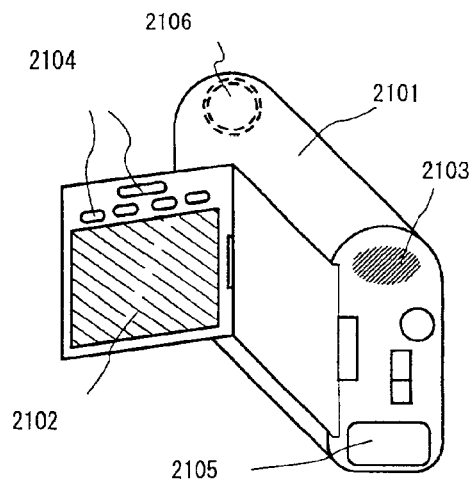

FIG. 21B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 21C:
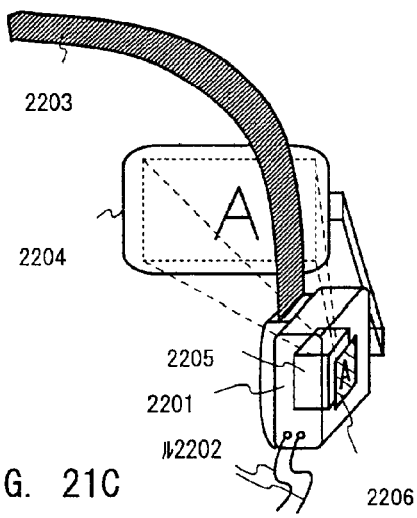

FIG. 21C illustrates a portion (the right-half piece) of an EL display of head mount type, which includes a main body 2201, signal cables 2202, a head mount band 2203, a screen portion 2204, an optical system 2205, an EL display device 2206, or the like. The present invention is applicable to the EL display device 2206.

Figure 21D:
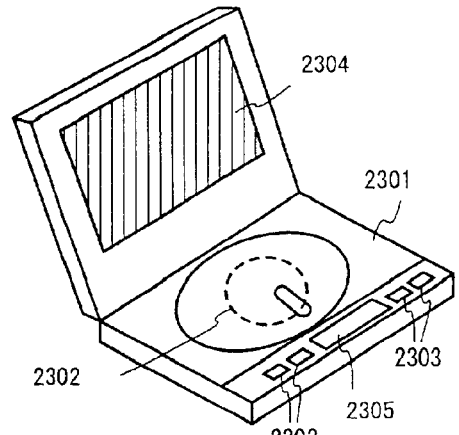

FIG. 21D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) 2304 and (b)2305. The image reproduction apparatus including a recording medium further includes a game machine or the like.

Figure 21E:
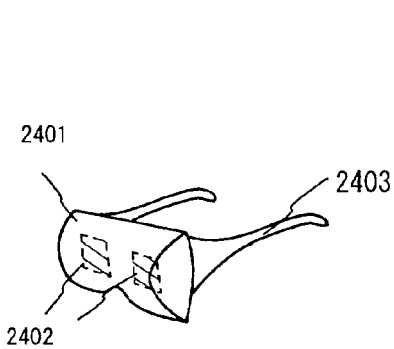

FIG. 21E illustrates a goggle type display (head mounted display) which includes a main body 2401, a display portion 2402, and an arm portion 2403. The EL display device in accordance with the present invention can be used as the display portion 2402.

Figure 21F:
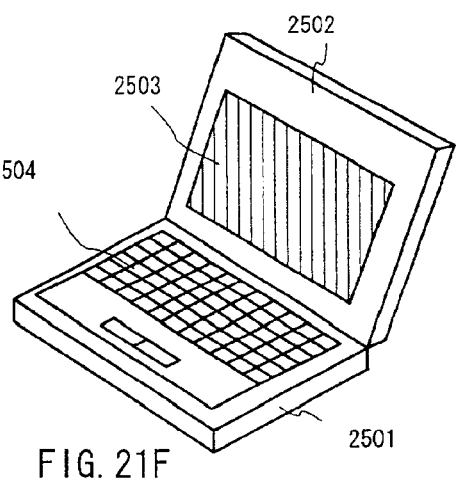

FIG. 21F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a cellular telephone or a sound reproduction equipment, it is desirable to drive the EL display device so that the character information is formed by a light-emitting portion while a non-emission portion corresponds to the background.

Figure 22A:
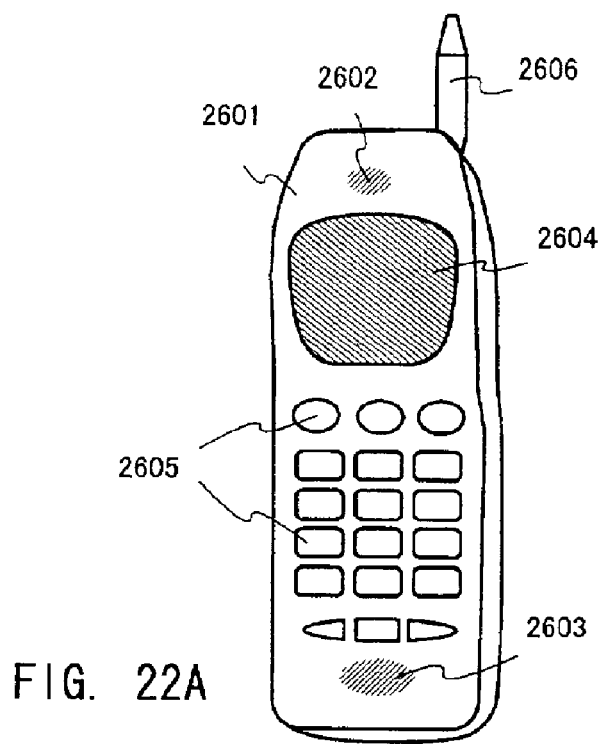
FIGS. 22A and 22B show specific examples of electronic equipment.

With now reference to FIG. 22A, a cellular telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 22B:
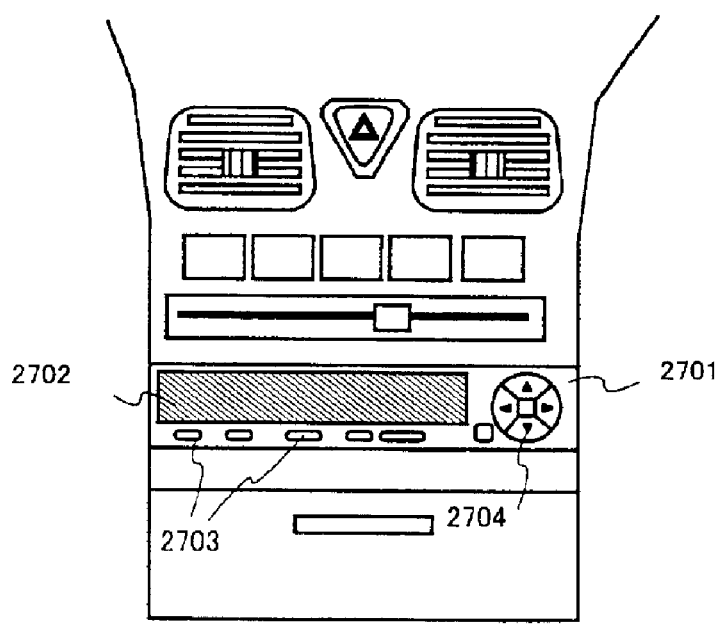
Figure 23:
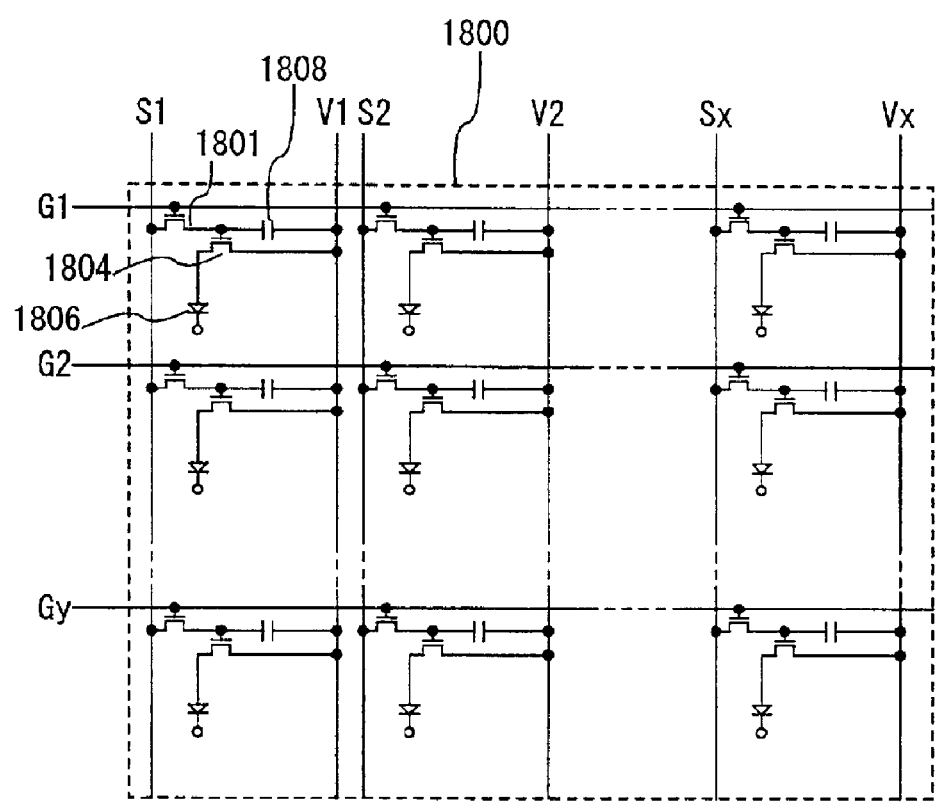
FIG. 23 is a circuit diagram showing a pixel portion of a conventional EL display.
Figure 24:
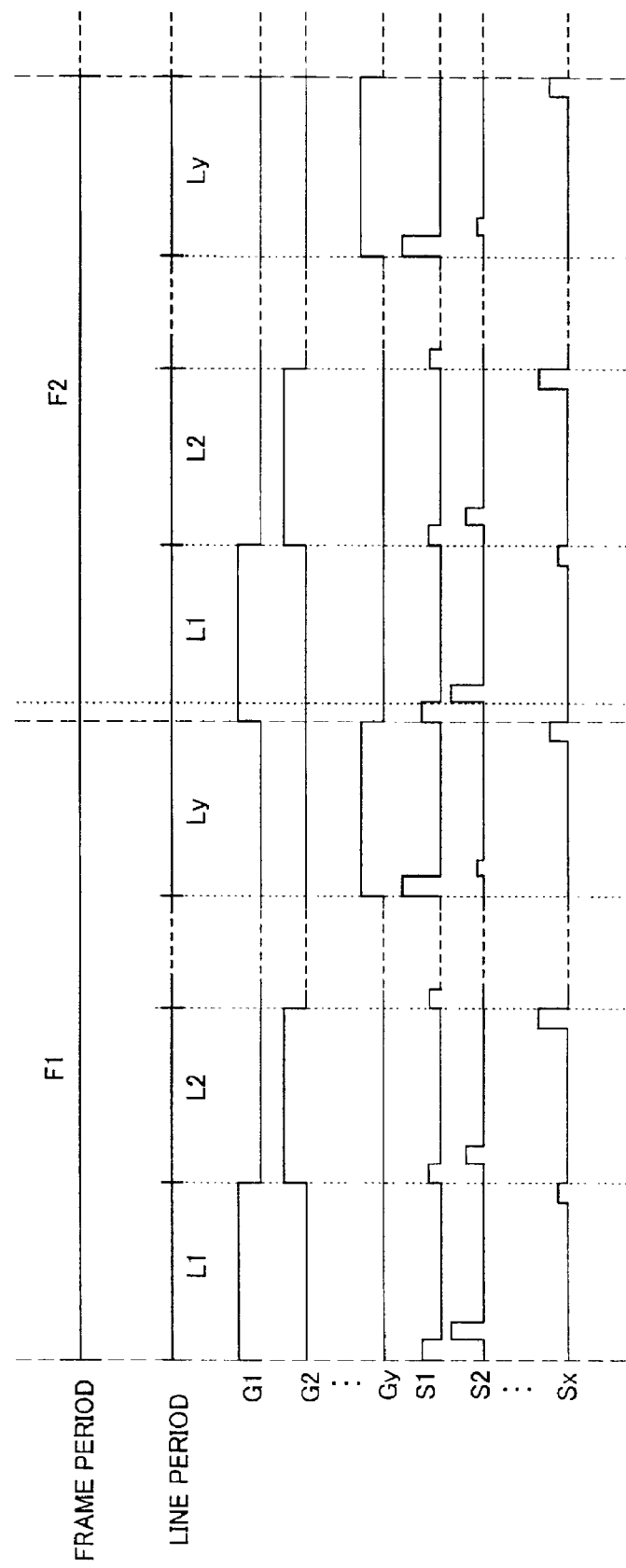
FIG. 24 is a timing chart showing a driving method of the conventional EL display.
Figure 25A:
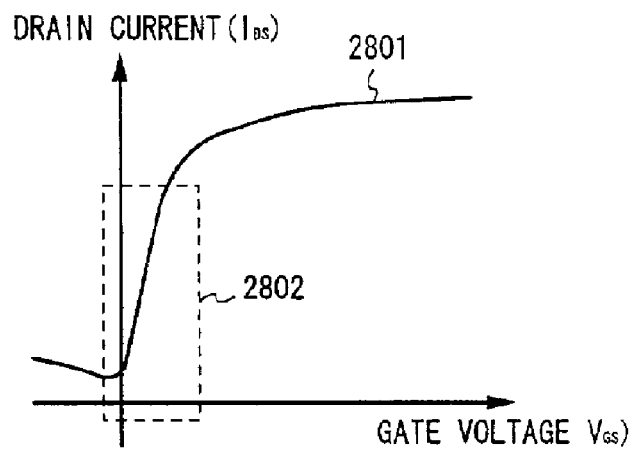
FIGS. 25A and 25B are graphs showing an $I_{DS}$-$V_{GS}$ characteristic of the TFT.
Figure 25B:
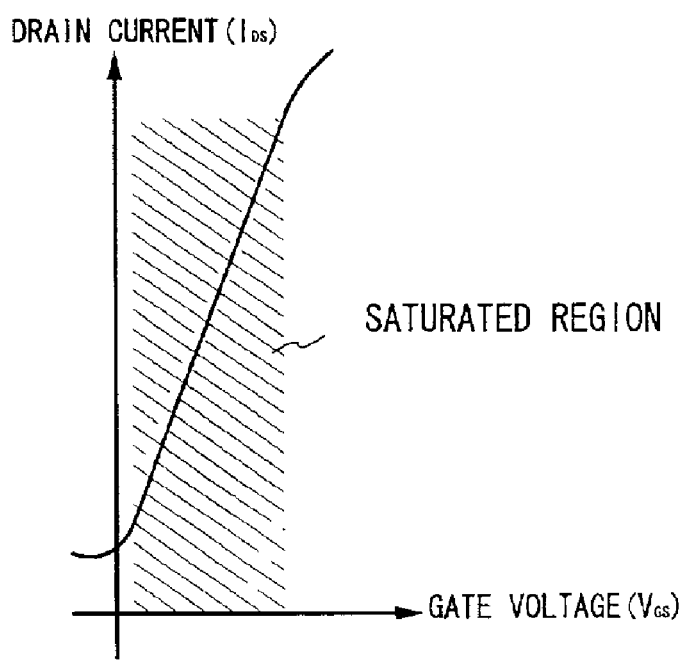

FIG. 22B illustrates a sound reproduction device, a car audio equipment in concrete term, which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to a sound reproduction device of portable type or home type. The display portion 2702 can reduce power consumption by displaying white-colored characters on a black-colored background, which is particularly advantageous for the sound reproduction device of the portable type.

As set forth above, the present invention can be applied variously to a wide range of electric apparatuses in all fields. The electronic device in the present embodiment can be obtained by utilizing an EL display device having the configuration in which the structures in Embodiments 1 through 13 are freely combined.

In accordance with the above structures, even if there is some dispersion in the $I_{DS}$-$V_{GS}$ characteristic of the EL driver TFT, dispersion in the amount of electric current output when equal gate voltages are applied to the EL driver TFTs can be suppressed with the present invention. Therefore, it becomes possible to avoid a situation in which, due to the fluctuation in the $I_{DS}$-$V_{GS}$ characteristic, the amount of light emitted by the EL elements differs greatly for adjacent pixels when signals having the same voltage are input.

Further, in the present invention, non-light emitting periods during which display is not performed can be formed. If a completely white image is displayed in an EL display device when using a conventional analog driving method, then the EL elements always emit light and this becomes a cause of quickening EL layer degradation. Non-light emitting periods can be formed with the present invention, and therefore degradation of the EL layers can be suppressed to a certain extent.

What is claimed is:

1. A light emitting device comprising:
    a source signal line driver circuit;
    a gate signal line driver circuit;
    an opposing power source line driver circuit;
    a pixel portion comprising a plurality of pixels;
    a plurality of source signal lines connected to the source signal line driver circuit;
    a plurality of gate signal lines connected to the gate signal line driver circuit;
    a plurality of opposing rower source lines connected to the opposing power source line driver circuit; and
    a plurality of power source supply lines,
    wherein each pixel comprises:
        a switching TFT having a gate electrode connected to any one of the plural gate signal lines, and a source region and a drain region one of which is connected to any one of the plural source signal lines;
        an electro luminescence driver TFT, a gate electrode of said electro luminescence driver TFT connected to the other of said source region and said drain region of switching TFT;
        an electroluminescence element comprises a pixel electrode, an opposing electrode connected to any one of the plural opposing power source lines, and an electro luminescence layer provided between the pixel electrode and the opposing electrode;
    wherein the electro luminescence driver TFT has a source region connected to any one of the plural power source supply lines, and the electro luminescence driver TFT has a drain region connected to the pixel electrode.

2. A device according to claim 1, wherein the electro luminescence layer is formed of a monomer organic material or a polymer organic material.

3. A device according to claim 2, wherein the monomer organic material comprises Alq$_3$, (tris-8-quinolilite-aluminum) or TPD (triphenylamine derivative).

4. A device according to claim 2, wherein the polymer organic material comprises PPV (polyphenylene vinylene), PVK (polyvinyl carvazole) or polycarbonate.

5. A device according to claim 1, wherein, when the pixel electrode is an anode, the electro luminescence driver TFT is a p-channel TFT.

6. A device according to claim 1, wherein, when the pixel electrode is a cathode, the electro luminescence driver TFT is an n-channel TFT.

7. A device according to claim 1, wherein the pixel electrode is connected to the drain region of the electro luminescence driver TFT directly or through at least one wiring, and wherein a bank is formed on a region where the pixel electrode is connected to the drain region of the electro luminescence driver TFT, or on a region where the pixel electrode is connected to at least one wiring.

8. A device according to claim 7, wherein the bank has a light-shielding property.

9. A device according to claim 1, wherein the switching TFT or the electro luminescence driver TFT is of top gate type.

10. A device according to claim 1, wherein the switching TFT or the electro luminescence driver TFT is of bottom gate type.

11. A device according to claim 1, wherein the electro luminescence driver TFT is driven in a linear range.

12. A device according to claim 1, wherein the light emitting device is a computer.

13. A device according to claim 1, wherein the light emitting device is a video camera.

14. A device according to claim 1, wherein the light emitting device is a DVD player.

15. A light emitting device comprising:
a source signal line driver circuit;
a gate signal line driver circuit;
an opposing power source line driver circuit;
a pixel portion having a plurality of pixels, each pixel comprising a switching TFT, an electro luminescence driver TFT and an electro luminescence elexpent;
a plurality of source signal lines connected to the source signal line driver circuit;
a plurality of gate signal lines connected to the gate signal line driver circuit;
a plurality of opposing power source lines connected to the opposing power source line driver circuit; and
a plurality of power source supply lines,
wherein:
the electro luminescence element comprises a pixel electrode, an opposing electrode, and an electro luminescence layer provided between the pixel electrode and the opposing electrode; and
the opposing electrode is connected to one of the plural opposing power source lines.

16. A device according to claim 15, wherein the electro luminescence layer comprises a monomer organic material or a polymer organic material.

17. A device according to claim 15, wherein the monomer organic material comprises Alq$_3$ (tris-8-quinolilite-aluminum) or TPD (triphenylamine derivative).

18. A device according to claim 15, wherein the polymer organic material comprises PPV (polyphenylene vinylene), PVK (polyvinyl carvazole) or polycarbonate.

19. A device according to claim 15, wherein, when the pixel electrode is an anode, the electro luminescence driver TFT is a p-channel TFT.

20. A device according to claim 15, wherein, when the pixel electrode is a cathode, the electro luminescence driver TFT is an n-channel TFT.

21. A device according to claim 15, wherein the pixel electrode is connected to a drain region of the electro luminescence driver TFT directly or through at least one wiring, and wherein a bank is formed on a region where the pixel electrode is connected to the drain region of the electro luminescence driver TFT, or on a region where the pixel electrode is connected to at least one wiring.

22. A device according to claim 21, wherein the bank has a light-shielding property.

23. A device according to claim 15, wherein the switching TFT or the electro luminescence driver TFT is of top gate type.

24. A device according to claim 15, wherein the switching TFT or the electro luminescence driver TFT is of bottom gate type.

25. A device according to claim 15, wherein the opposing power source lines are arranged such that adjacent pixels that are connected to a common source signal line are connected to different opposing power source lines.

26. A device according to claim 1, wherein the opposing power source lines are arranged such that adjacent pixels that are connected to a common source signal line are connected to different opposing power source lines.

27. A personal computer comprising an EL display device, a main body, and a keyboard, with the EL display device comprising:
a source signal line driver circuit;
a gate signal line driver circuit;
an opposing power source line driver circuit;
a pixel portion comprising a plurality of pixels;
a plurality of source signal lines connected to the source signal line driver circuit;
a plurality of gate signal lines connected to the gate signal line driver circuit;
a plurality of opposing power source lines connected to the opposing power source line driver circuit; and
a plurality of power source supply lines,
wherein each pixel comprises:
a switching TFT having a gate electrode connected to any one of the plural gate signal lines and a source region and a drain region, with one of the source region and the drain region being connected to any one of the source signal lines;
an electro luminescence driver TFT having a gate electrode connected to the other of said source region and said drain region of the switching TFT; and
an electro luminescence element comprising a pixel electrode, an opposing electrode connected to any one of the plural opposing power source lines, and an electro luminescence layer provided between the pixel electrode and the opposing electrode;
wherein the electro luminescence driver TFT has a source region connected to any one of the plural power source supply lines and a drain region connected to the pixel electrode.

28. A personal computer according to claim 27, wherein the electro luminescence layer is formed of a monomer organic material or a polymer organic material.

29. A personal computer according to claim 28, wherein the monomer organic material comprises Alq$_3$, (tris-8-quinolilite-aluminum) or TPD (triphenylamine derivative).

30. A personal computer according to claim 28, wherein the polymer organic material comprises PPV (polyphenylene vinylene), PVK (polyvinyl carvazole) or polycarbonate.

31. A personal computer according to claim 27, wherein, when the pixel electrode is an anode, the electro luminescence driver TFT is a p-channel TFT.

32. A personal computer according to claim 27, wherein, when the pixel electrode is a cathode, the electro luminescence driver TFT is an n-channel TFT.

33. A personal computer according to claim 27, wherein the pixel electrode is connected to the drain region of the electro luminescence driver TFT directly or through at least one wiring, and wherein a bank is formed on a region where the pixel electrode is connected to the drain region of the electro luminescence driver TFT, or on a region where the pixel electrode is connected to at least one wiring.

34. A personal computer according to claim 33, wherein the bank has a light-shielding property.

35. A personal computer according to claim 27, wherein the switching TFT or the electro luminescence driver TFT is of top gate type.

36. A personal computer according to claim 27, wherein the switching TFT or the electro luminescence driver TFT is of bottom gate type.

37. A personal computer according to claim 27, wherein the electro luminescence driver TFT is driven in a linear range.

38. A personal computer according to claim 27, wherein the opposing power source lines are arranged such that adjacent pixels that are connected to a common source signal line are connected to different opposing power source lines.

39. A cellular telephone comprising a main body, an audio output portion, an audio input portion, a display portion, an operation switch, and an antenna, with the display portion comprising:

a source signal line driver circuit;

a gate signal line driver circuit;

an opposing power source line driver circuit;

a pixel portion comprising a plurality of pixels;

a plurality of source signal lines connected to the source signal line driver circuit;

a plurality of gate signal lines connected to the gate signal line driver circuit;

a plurality of opposing power source lines connected to the opposing power source line driver circuit; and a plurality of power source supply lines, wherein each pixel comprises:

a switching TFT having a gate electrode connected to any one of the plural gate signal lines and a source region and a drain region, with one of the source region and the drain region being connected to any one of the source signal lines;

an electro luminescence driver TFT having a gate electrode connected to the other of said source region and said drain region of switching TFT;

an electro luminescence element comprises a pixel electrode, an opposing electrode connected to any one of the plural opposing power source lines, and an electro luminescence layer provided between the pixel electrode and the opposing electrode;

wherein the electro luminescence driver TFT has a source region connected to any one of the plural power source supply lines and a drain region connected to the pixel electrode.

40. A cellular telephone according to claim 39, wherein the electro luminescence layer is formed of a monomer organic material or a polymer organic material.

41. A cellular telephone according to claim 40, wherein the monomer organic material comprises Alq$_3$, (tris-8-quinolilite-aluminum) or TPD (triphenylaniine derivative).

42. A cellular telephone according to claim 40, wherein the polymer organic material comprises PPV (polyphenylene vinylene), PVK (polyvinyl carvazole) or polycarbonate.

43. A cellular telephone according to claim 39, wherein, when the pixel electrode is an anode, the electro luminescence driver TFT is a p-channel TFT.

44. A cellular telephone according to claim 39, wherein, when the pixel electrode is a cathode, the electro luminescence driver TFT is an n-channel TFT.

45. A cellular telephone according to claim 39, wherein the pixel electrode is connected to the drain region of the electro luminescence driver TFT directly or through at least one wiring, and wherein a bank is formed on a region where the pixel electrode is connected to the drain region of the electro luminescence driver TFT, or on a region where the pixel electrode is connected to at least one wiring.

46. A cellular telephone according to claim 45, wherein the bank has a light-shielding property.

47. A cellular telephone according to claim 39, wherein the switching TFT or the electro luminescence driver TFT is of top gate type.

48. A cellular telephone according to claim 39, wherein the switching TFT or the electro luminescence driver TFT is of bottom gate type.

49. A cellular telephone according to claim 39, wherein the electro luminescence driver TFT is driven in a linear range.

50. A cellular telephone according to claim 39, wherein the opposing power source lines are arranged such that adjacent pixels that are connected to a coninion source signal line are connected to different opposing power source lines.

* * * * *